United States Patent [19]

Nishizawa

[11] 4,284,997
[45] Aug. 18, 1981

[54] STATIC INDUCTION TRANSISTOR AND ITS APPLIED DEVICES

[75] Inventor: Jun-ichi Nishizawa, Sendai, Japan

[73] Assignee: Zaidan Hojin Handotai Kenkyu Shinkokai, Sendai, Japan

[21] Appl. No.: 920,542

[22] Filed: Jun. 29, 1978

[30] Foreign Application Priority Data

| Jul. 7, 1977 [JP] | Japan | 52-81796 |
| Jul. 27, 1977 [JP] | Japan | 52-90018 |
| Jul. 29, 1977 [JP] | Japan | 52-91699 |
| Sep. 14, 1977 [JP] | Japan | 52-110914 |
| Sep. 22, 1977 [JP] | Japan | 52-114316 |
| Dec. 20, 1977 [JP] | Japan | 52-154197 |

[51] Int. Cl.$^3$ .......................................... H01L 29/80
[52] U.S. Cl. ......................................... 357/22; 357/15; 357/23; 357/41; 357/45
[58] Field of Search ........................ 357/22, 15, 23, 41, 357/45

[56] References Cited

U.S. PATENT DOCUMENTS

| 3,828,230 | 8/1974 | Nishizawa et al. ................ 357/22 |
| 4,048,646 | 9/1977 | Ogawa et al. ..................... 357/22 |

*Primary Examiner*—Edward J. Wojciechowicz
*Attorney, Agent, or Firm*—Cushman, Darby & Cushman

[57] ABSTRACT

In a static induction transistor, the gate structure is split into two separate gates facing each other to cooperatively define therebetween a channel or channels of this transistor. One of these two separate gates is operative as a driving gate for driving the transistor in response to a driving signal applied thereto, while the other one is operative as a non-driving gate which has no driving signal applied. The non-driving gate may be held at a certain potential or floated. Such split-gate structure provides a higher operating speed of the transistor, and can be effectively applied to semiconductor memory devices.

In such a memory device having split-gate structures, a plurality of field effect type semiconductor memory cells are formed perpendicular to a surface of a semiconductor wafer to enhance a high packing density of the memory device. Charge carriers are transported in the semiconductor bulk through channels defined by the split-gate structure, thereby enhancing a high-speed operation of the memory device.

82 Claims, 85 Drawing Figures

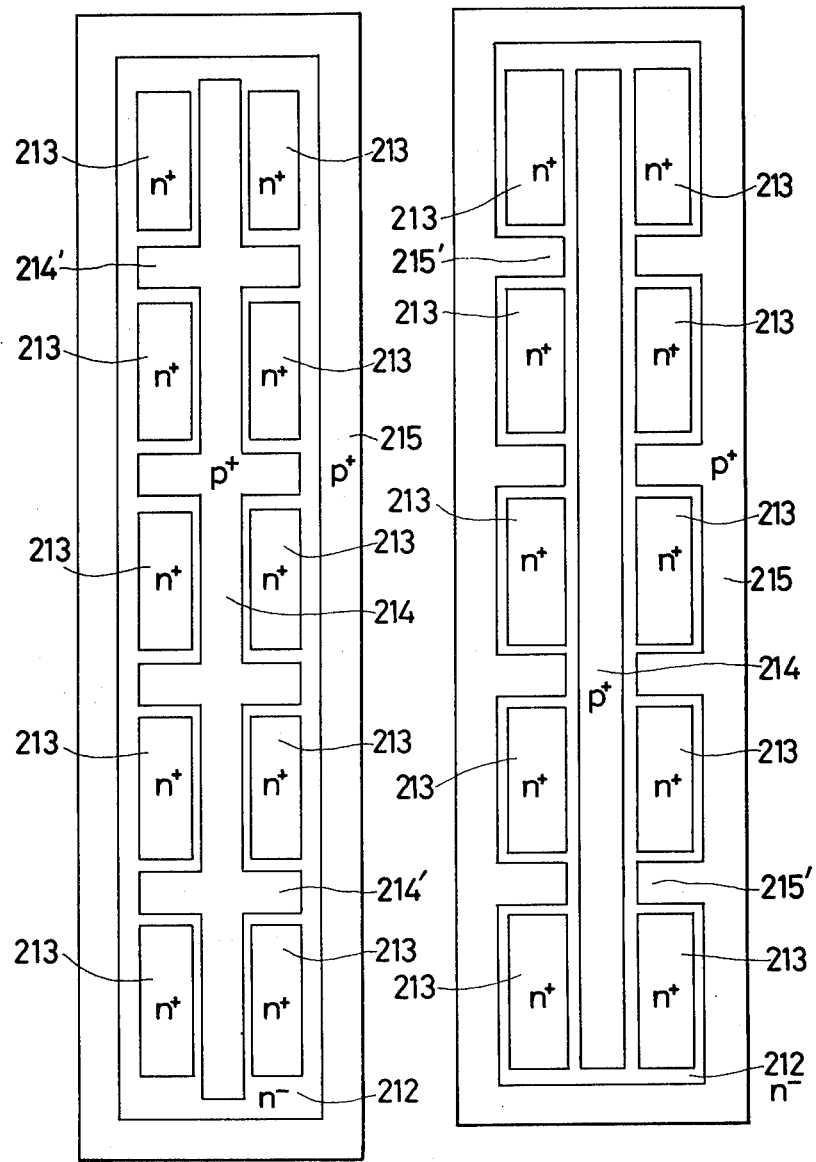

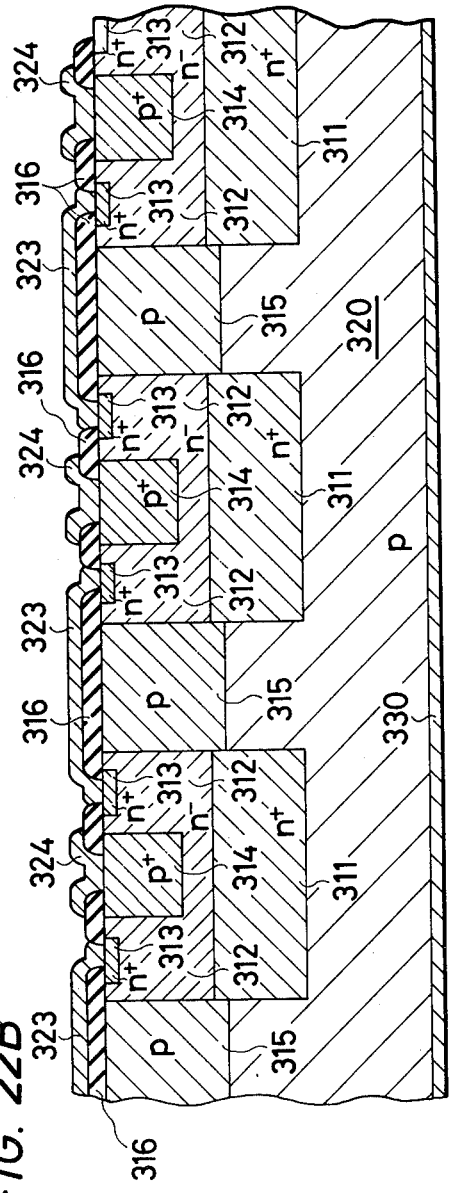
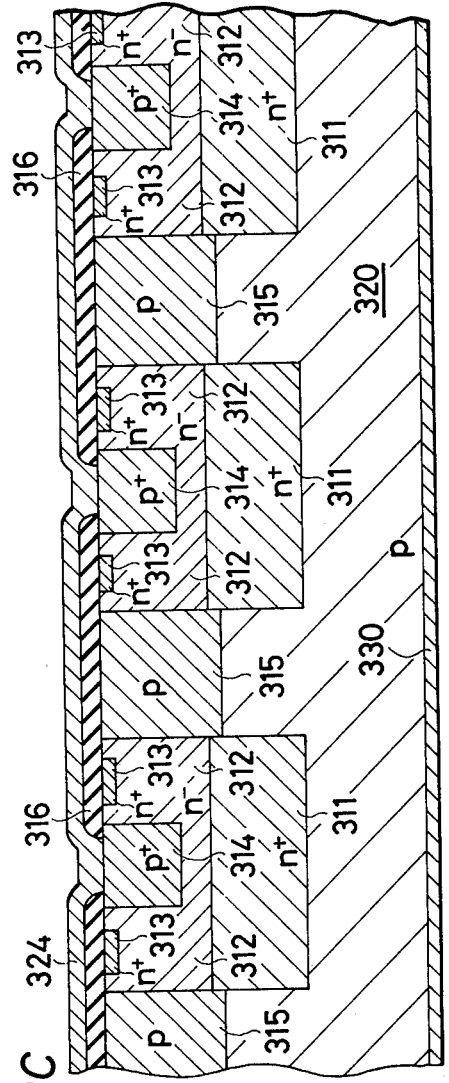
FIG. 22B
FIG. 22C

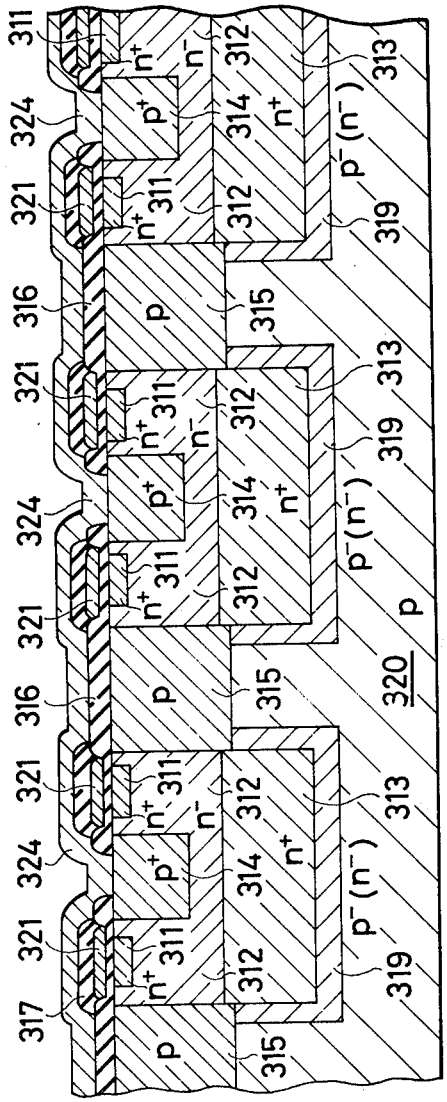
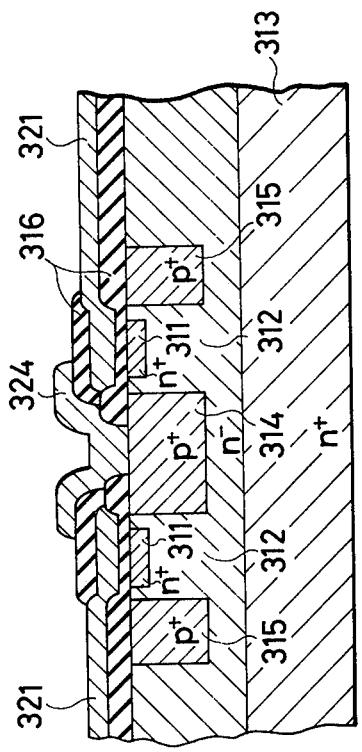
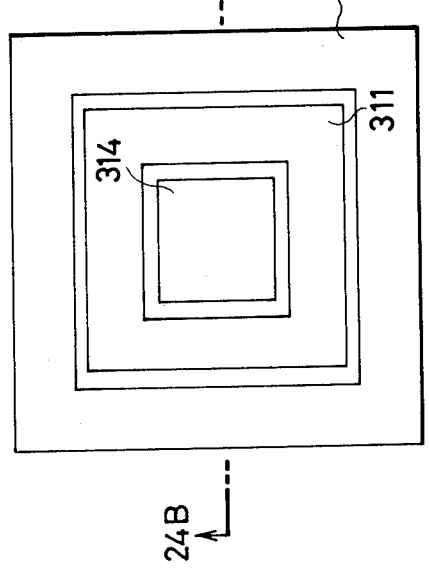
FIG. 23B
FIG. 24A
FIG. 24B

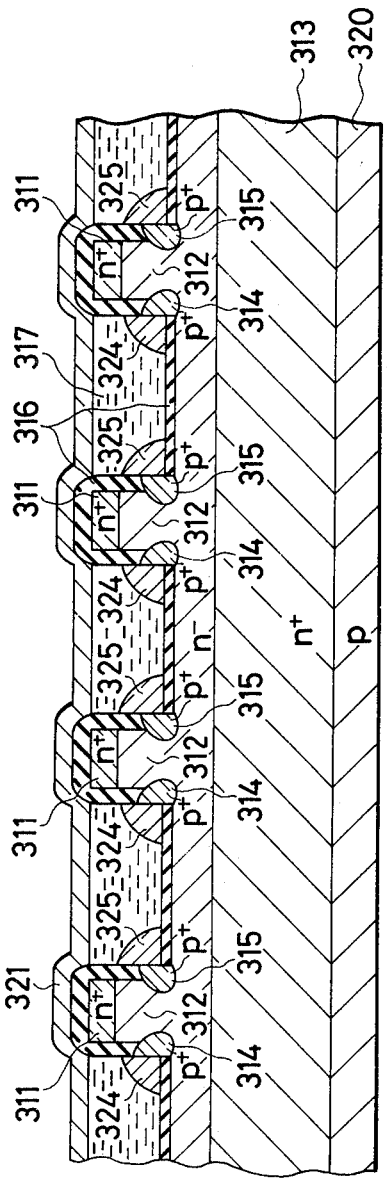

STATIC INDUCTION TRANSISTOR AND ITS APPLIED DEVICES

BACKGROUND OF THE INVENTION (a) Field of the Invention

The present invention relates to semiconductor devices, and more particularly it pertains to semiconductor devices such as modified IIL-type logic device and memory device having improved gate structures.

(b) Description of the Prior Art

Static induction transistors (SIT's) have been proposed first by the present inventor, and they actually have been put into use in some electronics fields, e.g. amplifier circuits, integrated logic devices, semiconductor memories and so forth. The SIT, as is well known, has many advantages over conventional bipolar and unipolar transistors in such aspects as high operating speed, high transconductance, low power dissipation, simple manufacturing process, high density integration and so on.

Those merits of the SIT can be effectively applied in integrated semiconductor devices such modified IIL-type logic devices as those disclosed in Japanese patent application No. 50-146588 (corresponding U.S. patent application No. 748,292 filed on Dec. 7, 1976) and Japanese patent application No. 51-92467 (corresponding U.S. patent application No. 819,343 filed on July 27, 1977). Such modified IIL-type logic devices have a basic arrangement as shown in FIGS. 1A and 1B.

FIG. 1A is a partially broken-away top plan view of these known IIL-type logic devices, mentioned above and FIG. 1B is a vertical sectional view taken along the line 1B–1B' in FIG. 1A. As shown, the device includes a heavily doped n+ type semiconductor substrate 11 and a lightly doped n− type semiconductor layer 12 deposited on the n+ type substrate 11. In this n− type semiconductor layer 12, there are formed heavily doped p+ type regions 14 and 50. The p+ type region 14 surrounds two separate portions of the n− type layer 12, thereby defining two separate current channels of an SIT as will be explained later in further detail. In the upper portions of those two current channel portions are formed heavily doped n+ type regions 13 which are operative as the drain (or source) regions of the SIT. On top of the respective n+, p+ and p+ regions 13, 14 and 50, there are deposited ohmic contact electrodes 23, 24 and 60. And also, another ohmic contact electrode 21 is formed at the bottom surface of the n+ type substrate 11. Reference numeral 16 represents a passivation film layer.

The above-mentioned device may be represented in an equivalent circuit in FIG. 1C, wherein an SIT $Q_1$ with two drains, a source and a gate, and a bipolar transistor $Q_2$ with a base, a collector and an emitter are shown. The SIT $Q_1$ will be referred to as a driver or inverter transistor, whereas the bipolar transistor $Q_2$ will be referred to as an injector or load transistor. The collector of the injector transistor $Q_2$ is merged in and connected to the gate of the driver, transistor $Q_1$ as will be described below in further detail.

The correlationship between FIG. 1C and FIGS. 1A and 1B is as follows. The injector is constituted by the region 50 (serving as the emitter region), the region 14 (serving as the collector region) and a portion of the layer located between the regions 14 and 50 (serving as the base region). The driver, i.e. a two-channel SIT, is formed by: the substrate 11 (serving here as the source region); the region 14 (serving as the gate region merged with the collector region); the region 13 (serving as the drain region); and those portions of the layer 12 defined by the gate region (which serve as the current channel regions).

With the simple structure described above, there has been obtained a modified IIL-type logic device which provides a power-delay product minimized to as low as 0.002 pJ at a low current operation condition, and a minimum propagation delay time of 13.8 nano-seconds or less at a power dissipation of 230 micro-watts. Furthermore, with some additional modifications such as those disclosed in Japanese patent application Nos. 51-143698 and 51-147253, there has been easily materialized a specimen of such IIL-type logic device whose minimum delay time is as small as a few nano-seconds or less.

In such modified IIL-type logic device, the limitation of the operating speed is caused mainly by a time delay for charging up the gate capacitance of the driver SIT and by a time delay due to minority carrier storage effect in the driver SIT. This will hereunder be explained in further detail. In order to achieve quick turning-on of the driver SIT, it is necessary for the gate potential to rapidly rise up to a certain voltage (typically 0.4–0.8 volt) with respect to the source so as to turn the current channel to be rendered conductive. As the driver SIT has a capacitance at the gate, the driver SIT is inherently accompanied by a time delay for driving, i.e. charging the gate capacitance thereof. This gate capacitance of the SIT is significantly small, but it serves to limit the maximum operation speed. On the other hand, when the driver SIT is in the conductive state, a certain amount of minority carriers are being injected from the forward-biased gate into the current channel. The injected minority carriers will develop an electric field which acts to attract majority carriers from the source into the current channel. This action of the injected minority carriers is considered to be effective for the SIT to supply a sufficient magnitude of drain current, even if the drain is held at a relatively low potential (typically 0.1–0.2 volt) with respect to the source. However, the minority carriers in the current channel will bring about an adverse storage effect in turning the SIT off, leading to a delayed turn-off action of this SIT.

On the other hand, semiconductor memory devices are developed to an extent that one transistor forms one memory cell. In such a structure, a memory cell is formed with a source region for supplying and retrieving charge carriers, a storage region for storing charge carriers and a channel region located between said two regions for controlling the flow of charge carriers therebetween under the control of a gate region. Among such memory cells, there are those types such as the so-called MOS FET type and the charge-coupled device type. However, memory cells of these two types occupy a rather large area in the surface of a semiconductor memory device.

Furthermore, charge carriers are transported mainly by the surface mobility in such devices. However, the bulk mobility in a semiconductor body is usually higher than the surface mobility due to various surface conditions such as trapping levels.

With respect to FET's, there have been developed a few which are provided with a plurality of gate electrodes for modifying their current-voltage characteristics. Among these latter FET's, TECNETRON and ARCATRON, for example, are known. These FET's are provided with a plurality of gate electrodes for controlling depletion layer in a channel region located between a source region and a drain region. However, these FET's exhibit mere conventional current-voltage characteristics, namely saturating pentode-like characteristics. Moreover, ARCATRON have a planar type structure of an FET with a small first gate region and a large second gate region for controlling the channel region, occupies a considerably large area in the surface of a semiconductor body. Therefore, when it is used in a memory device, a high packing density can not be realized.

Thus, ARCATRONS and TECNETRONS can not afford a semiconductor device of a high-speed operation and a high packing density.

While, a static induction transistor or a punchthrough type bipolar transistor which is employed in the present invention is such transistor which exhibits nonsaturating triode-like characteristics thereby enhancing a high speed operation with a large current gain. Also an static induction transistor having a plurality of gate electrodes has been proposed by the present inventor (U.S. Ser. No. 757,583 filed on Dec. 27, 1976).

A highly improved memory device is disclosed by the present inventor in his U.S. Ser. No. 878,441 filed on Feb. 16, 1978.

In the above-mentioned memory device, a memory cell is formed substantially perpendicular to the surface of the semiconductor body, and charge carriers are transported mainly by the bulk mobility, thereby raising the packing density and the operation speed, as well as reducing the power dissipation.

However, even in such devices, the operation speed is still subjected to limitation by the following factors, namely, the gate capacitance in the operative state and the space charge storage effect of the minority carriers.

FIG. 20A shows a diagrammatic top view of the conventional memory device and FIGS. 20B and 20C are diagrammatical sections of the memory device shown in FIG. 20A taken along lines 20B–20B' and 20C–20C', respectively.

In the Figures, the memory device comprises a p type substrate 115, an n+ type source region 113, a p+ type gate region 114 serving as a word line, an n− type channel region 112, an n+ type storage region 111 (an SIT is composed of a source region 113, a gate region 114, a channel region 112, and a drain region 111), a metal electrode 123 (made with aluminum, molybdenum or a low resistivity polycrystalline silicon or the like) which serves as a bit line, and an insulator region 116 formed with a silicon oxide ($SiO_2$), a silicon nitride ($Si_3N_4$) or an aluminum oxide ($Al_2O_3$), or with their combination, or the like. The memory array (see FIG. 20A) includes an SIT disposed at each cross point of the word lines and the bit lines. Typical impurity concentrations of the respective semiconductor regions are about: $10^{17}$ to $10^{21}$ cm$^{-3}$ for the storage region 111; $10^{17}$ to $10^{21}$ cm$^{-3}$ for the source region 113; $10^{11}$ to $10^{15}$ cm$^{-3}$ for the channel region 112; $10^{17}$ to $10^{21}$ cm$^{-3}$ for the gate region 114; and $10^{14}$ to $10^{18}$ cm$^{-3}$ for the substrate 115. The channel width between the gate region 114 is determined by the impurity concentration of the channel region 112 so that the channel region 112 will become pinched off only by the built-in (diffusion) potential established by the pn junction between the gate region 114 and the channel region 112. The storage region 111 forms also a capacitor for storing charge carriers. When charge carriers are stored in the storage region 111, the voltage of this storage region 111 will be raised accordingly to some extent.

Under the conditions stated above, however, the dimensions and the impurity concentrations of those regions forming the SIT must be selected so as to establish a potential barrier in the channel region, so that the charge carriers (electrons in this case) will not be allowed to flow into the storage region 111, from the source region 113 unless an external voltage is applied to the word line and/or bit line.

For example, when the impurity concentration of the n− type channel region 112 is selected to be $1\times10^{13}$ cm$^{-3}$, $1\times10^{14}$ cm$^{-3}$ or $1\times10^{15}$ cm$^{-3}$, the channel width is selected to be an appropriate value less than 20 μm, 6 μm and 2 μm, respectively. In case the distance between the storage region 111 and the source region 113 is reduced, the transit time of electrons for reading and writing can be reduced also. Therefore, it is desirable that the distance between the storage region 111 and the source region 113 be reduced.

Memory cells which are analogous to that shown in FIGS. 20A to 20C may be represented by the equivalent circuit diagrams shown in FIGS. 20D and 20E. In FIG. 20D, the circuit comprises an SIT 100, a capacitor 101, a bit line 123 and a word line 124, wherein charge carriers are stored in the capacitor 101 and are transported into the bit line 123 under the control of the gate region connected to the word line 124. On the other hand, a floating gate region is employed in FIG. 20E, wherein stored charge carriers in the capacitor 101 are transported into the bit line 123 by changing the voltage applied to the word line 124 relative to the bit line 123.

The operational behavior of the conventional memory device will become clear by the following description.

When it is desired to write data into a memory cell of FIGS. 20A to 20C, a positive voltage is applied to the word line (gate region) 114 to decrease the height of the potential barrier produced in the channel region 112, while at the same time a predetermined positive voltage is given to the bit line 123. In this case, since the height of the potential barrier established in the channel region 112 is decreased, electrons are allowed to flow into the source region 113 from the storage region 111. As electrons flow from the storage region 111, the voltage of the storage region 111 becomes higher in the positive polarity due to the lack of electrons having a negative charge. When the voltage of the bit line (for writing) 123 becomes equal to the voltage of the storage region 11, electrons will cease to flow. In case the voltage applied for writing data is removed, then the potential barrier reappears in the channel region 112, and accordingly the storage region 111 is held charged with a positive voltage. When it is desired to read data (to retrieve data), a predetermined negative voltage is applied to the bit line 123, while at the same time a forward voltage (positive voltage in this case) is given to the word line (gate region) 114. Whereupon, electrons are allowed to flow into the storage region 111 from the source region 113. By the appearance of this current, it can be determined as to whether or not the memory cell is in the state of either "1" or "0".

In the above-stated memory devices, the gate region 114 is formed to completely surround the channel region 112. Thus, if the gate region 114 is used to serve as a word line, the capacitance of the word line 114 is not sufficiently small for achieving a high-speed reading and writing operation.

FIGS. 21A and 21B are diagrammatic sectional views of another semiconductor memory device. This memory device comprises an n+ type source region 113 to serve as a bit line for reading, an n− type channel region 112, an n+ type storage region 111, a p+ type gate region 114 to serve as a word line, a metal electrode 121 to serve as a bit line for writing, and an insulator region 116 forming a metal-insulator-semiconductor (MIS) structure. The memory storage region 111 is disposed in the surface of the semiconductor body. This region 111 may also be disposed in an inner region located apart from the surface.

When it is desired to transport electrons into the storage region 111, a positive voltage is applied to the word line 114, while a positive voltage is given to the bit line (for writing) 121. Then, electrons will flow into the storage region through the channel region 112, from the source region 113.

When it is desired to keep the electrons stored in the storage region 111, the voltage given to the bit line (for writing) 121 may be lowered to about one half of the voltage for transporting electrons into the storage region 111.

When it is desired to read data or retrieve electrons from the storage region 111, the voltage of the bit line (for writing) 121 is re-set, to for example the ground potential, while a positive voltage is given to the word line 114. Then, electrons which have been stored in the storage region 111 become able to flow into the source region 113 (serving as a bit line for reading) through the channel region 112, and thus the presence of electrons stored in the storage region 111 can be detected. Also, the shortage of charge carriers may be utilized to represent the state of storage.

In FIGS. 21A and 21B mentioned above, the gate region 114 is provided so as to surround the channel region 112, and therefore in case the gate region 114 is utilized as a word line, the capacitance of the gate region will not be negligible in the operative state. However, it is preferable to minimize the gate capacitance as small as possible for attaining a higher operation speed.

In the above-mentioned device, a punch-through current should not be allowed to flow between the gate region 114 and the substrate 115, and the charges which are stored in the storage region 111 must be preserved for an extended period of time. Therefore, an excessively high voltage cannot be applied between the respective regions. A punch-through current should be carefully avoided in such structure where the storage capacitance is formed between the storage region 111 and the substrate 115, and also where the storage capacitance is formed by the capacitance of a MOS (metal-oxide-semiconductor) disposed in the vicinity of the surface of the semiconductor body.

SUMMARY OF THE INVENTION

It is, therefore, a general object of the present invention to provide semiconductor devices which are improved in their operating speed.

An object of the present invention, therefore, is to provide an improved SIT which is superior in operating speed to prior art SIT's.

The SIT according to the present invention is characterized in that: the gate structure is split into two separate gates facing each other to define therebetween one or plural current channels; one of the two gates is operative as a driving gate for driving the SIT in response to a driving signal applied thereto, while the other one of the gates is operative as a non-driving gate having no driving signal applied thereto. The non-driving gate is adapted to either be held at a certain potential or floated.

Another object of the present invention is to provide an improved IIL-type logic device employing an SIT having an improved gate structure to serve as the driver transistor, which is capable of making switching actions at a higher speed.

Still another object of the present invention to provide a semiconductor memory device including a multiplicity of memory cells arranged in a matrix of rows and columns in a semiconductor bulk, which is capable of achieving a high-speed operation, by minimizing the capacitance of the gate region and by eliminating the space charge storage effect.

A further object of the present invention is to provide a high-density semiconductor memory device.

A still further object of the present invention is to provide a semiconductor device which can be operated at a low power dissipation.

A yet further object of the present invention is to provide a random access memory device having a high operation speed.

A yet another of the present invention is to provide a non-volatile random access memory device having a high packing density.

BRIEF DESCRIPTION OF THE DRAWINGS

FIGS. 4A through 4F are diagrammatic top plan views, respectively of different examples of the SIT according to the present invention.

FIGS. 22B and 22C are diagrammatic sections, respectively, to be conceived as being taken along the lines 22B–22B' and 22C–22C' in FIG. 22A.

FIGS. 23A and 23B are diagrammatic sections of another modification of the semiconductor memory device shown in FIG. 22A.

FIG. 24A is an explanatory diagrammatic top plan view of another example of a semiconductor memory device according to an embodiment of the present invention.

FIG. 24B is a cross section, to be conceived as being taken along the line 24B–24B' of FIG. 24A.

FIGS. 28A to 28C diagrammatically show different examples of a section of the semiconductor memory device taken along the line 27B–27B' in FIG. 27A.

DETAILED DESCRIPTION OF THE PRERERRED EMBODIMENTS

Figure 1A:
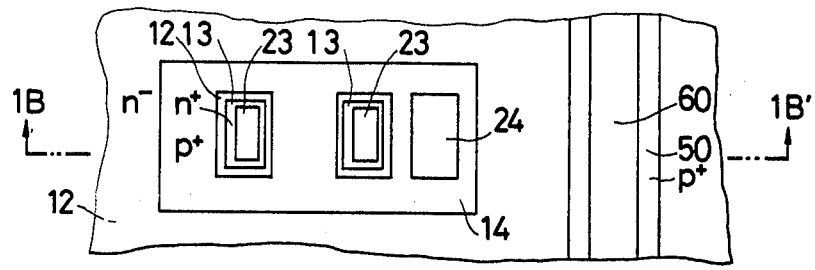
FIG. 1A shows an explanatory diagrammatic top plan view of a prior art IIL-type logic device employing a known SIT serving as the driver transistor.
Figure 1B:
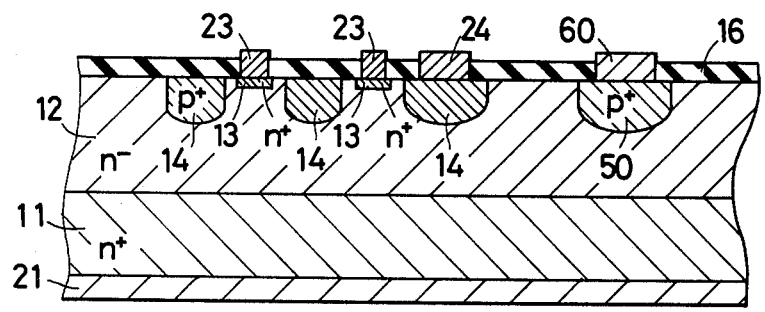
FIG. 1B is an explanatory diagrammatic vertical section, to be conceived as being taken along the line 1B–1B' in FIG. 1A.
Figure 1C:
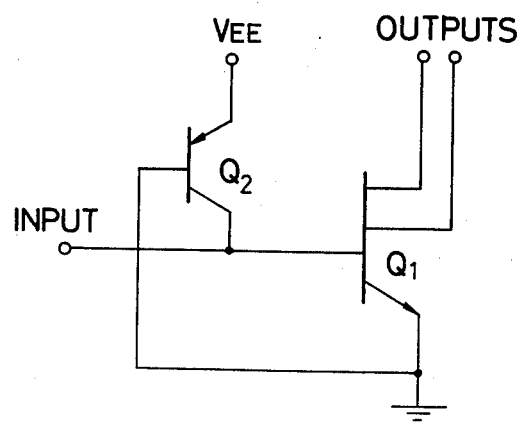
FIG. 1C shows an equivalent circuit for the device shown in FIGS. 1A and 1B.
Figure 2A:
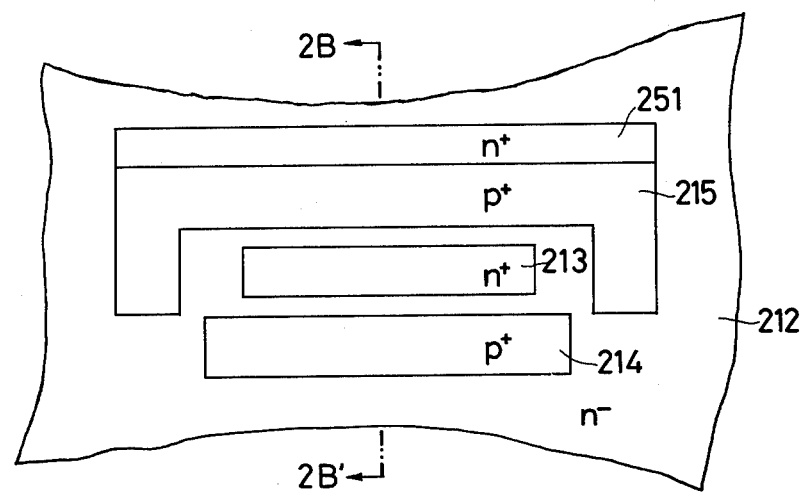
FIG. 2A shows an explanatory diagrammatic top plan view of an example of the SIT according to the present invention.
Figure 2B:
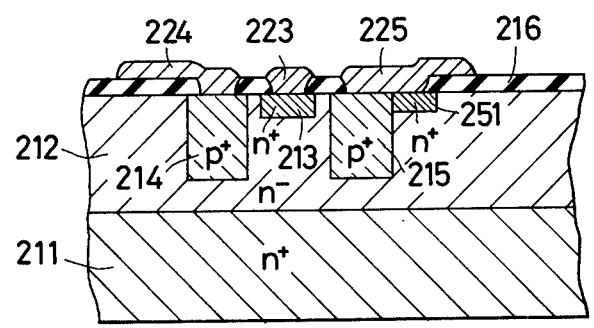
FIG. 2B is a vertical section, to be conceived as being taken along the line 2B–2B' in FIG. 2A.

An example of an improved SIT according to the present invention is illustrated diagrammatically in top plan view in FIG. 2A, and its vertical section taken along the line 2B–2B' of FIG. 2A is shown in FIG. 2B. This embodiment SIT includes a heavily doped n+ type semiconductor substrate 211 of a high impurity concentration ranging from $10^{17}$ to $10^{21}$ atoms/cm$^3$, and a lightly doped n$^-$ type (or substantially intrinsic type)

semiconductor layer 212 deposited on the substrate 211 and having a low impurity concentration between $10^{12}$ and $10^{16}$ atoms/cm$^3$. The substrate 211 is operative as a source region of the SIT. The layer 212 has a region therein defined as a current channel. This current channel region of the SIT is defined to be a portion of the layer 212 located between a pair of heavily doped p+ type semiconductor regions 214 and 215 which are formed in the layer 212 so as to face each other via the common current channel region. The impurity concentration of these respective regions 214 and 215 is dependent upon several factors such as the dimensions thereof, the impurity concentration of the layer 212 and the required operation mode of the SIT, but it is usually determined to have a value ranging from $10^{17}$ to $10^{21}$ atoms/cm$^3$. In the instance, however, wherein a normally-off type, i.e. an enhancement mode SIT, is required, the impurity concentration as well as the dimensions for the regions 214 and 215 are determined so that the regions 214 and 215 will exhibit a sufficient value of diffusion potential between these regions and that the current channel region becomes substantially completely depleted, i.e. the current channel region becomes pinched off by the induced depletion layers. In such an instance, it should be noted that the minimum distance between the regions 214 and 215 requires to be determined so as to prevent the occurrence of the so-called punch-through phenomenon between these regions. Such requirement may be met so long as the distance L satisfies the following condition:

$$\left( \frac{2\epsilon(V_{bi} - V)}{N_D e} \right)^{\frac{1}{2}} \leq L \leq 3 \left( \frac{2\epsilon(V_{bi} - V)}{N_D e} \right)^{\frac{1}{2}}$$

wherein $N_D$ and $\epsilon$ represent the impurity concentration and the dielectric constant of the current channel region, respectively; e represents a unit electron charge; $V_{bi}$ represents the built-in (diffusion) potential induced at the boundary between the gate regions 214, 215 and the current channel region, and V represents a typical voltage to be applied between the gate regions 214, 215 and the channel region. To satisfy this condition, those portions of the layer 212 at which there is the possibility for the occurrence of the punch-through phenomenon may preferably be given a higher impurity concentration by relying on the ion implantation technique or the selective diffusion technique, or alternatively there may be inserted any suitable insulator layer in these portions.

These regions 214 and 215 form a split-gate structure, which is a unique arrangement introduced according to the present invention. One 214 of these two regions is operative as a driving gate for driving the SIT in response to a driving signal which is applied thereto, while the other region 215 is intended to function as a non-driving gate which is not applied with the driving signal. The non-driving gate region 215 may be held at a certain potential or floated. In this embodiment, the non-driving gate region 215 is electrically connected to the substrate 211 through a heavily doped n+ type region 215 formed in the layer 212, an electrode 225 in ohmic contact with the regions 215 and 251, and the layer 212. As such, the non-driving gate region 215 is held at the same potential with the source potential.

In the upper portion of the layer 212 surrounded by the two gate regions 214 and 215, there is provided a heavily doped n+ type region 213 which is operative as a drain region of the SIT. Reference numerals 223 and 224 represent electrodes for the regions 213 and 214, respectively. Reference numeral 216 represents an insulator layer for passivation, which formed with an insulator material such as SiO$_2$, Si$_3$N$_4$ or Al$_2$O$_3$.

As stated above, the gate structure of the SIT embodying the present invention is split into two separate gates, i.e. the driving gate and the non-driving gate. Accordingly, the driving gate which actually will serve to control the current flow in the SIT has a reduced dimension, and accordingly the value of the parasitic capacitance at the driving gate, i.e. the gate capacitance, is decreased. The dimension as well as the parasitic capacitance of the driving gate are apparently less than those of the whole gate structure containing both the driving gate and non-driving gate. When such an SIT of the present invention is compared with a prior art SIT having the same dimension of the gate structure, the value of the input capacitance, i.e. the gate capacitance of the former, is considered to be less than one half of that of the latter. Such reduction in the gate capacitance will result in a less time-delay required for charging up the gate capacitance, and therefore a higher speed switching of the SIT can be attained.

Concerning the embodiment of FIGS. 2A and 2B, another advantage of the present invention will be explained hereunder. In the conductive state of the SIT when the driving gate is forwardly-biased, a certain amount of minority carriers (holes) are being injected from the driving gate into the current channel. This injection of minority carriers, as mentioned previously, causes a sufficient current to flow in a low drain potential condition, but it is responsible for the occurrence of minority carrier storage effect in the current channel. According to the present invention, however, this adverse effect due to the injected minority carriers can be substantially eliminated for the following reason. Namely, the minority carriers injected into the current channel, after travelling across the current channel, are effectively absorbed into the non-driving gate because the latter is held at the source potential which is lower than the driving gate potential.

Furthermore, when the forward bias given to the driving gate is removed, the injected minority charge carriers are quickly swept away into the non-driving gate region and also into the driving gate region. Therefore, a high-speed switching operation can be achieved.

With such arrangement as shown in FIGS. 2A and 2B, there is obtained an SIT whose power-delay product and propagation delay are about 0.6 pJ and 4.2 nano-seconds, respectively. In this SIT, the channel region has a dimension of 22×4.5 μm in a cross area and an impurity concentration of 1~2×10$^{13}$ atoms/cm$^3$, the diffusion depth of the gate regions being 2 μm, the diffusion depth of the drain region being 0.5 μm, the drain gate region being 6 μm wide, the surface impurity concentration of the driving gate region being 1×10$^{19}$ atoms/cm$^3$, and the thickness of the layer 212 being 4 μm. In contrast thereto, a corresponding prior art SIT wherein the design conditions are substantially the same except for that the gate structure is formed by a single continuous region (not split) provides a power-delay product of 2 pJ and a propagation delay of 8 nano-seconds.

Figure 2C:
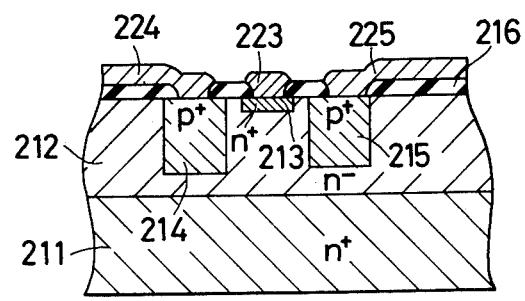
FIG. 2C is a diagrammatic vertical sectional view for explaining a modification of the embodiment illustrated in FIGS. 2A and 2C.

A modification of the SIT shown in FIGS. 2A and 2B is diagrammatically illustrated in FIG. 2C' in vertical section, wherein the region 251 intended for the connection to the substrate 211 in FIG. 2B is omitted, and the non-driving gate 215 is floated in the layer 212 so as not to be given a driving voltage, but it is provided with an electrode 225 for such instance as may be applied with a certain voltage depending on the purpose of use. With this arrangement, the SIT can be used while applying to the non-driving gate a given potential irrespective of the source potential as well as the driving gate potential. That is, it is possible to change the potential distribution in the current channel of the SIT in accordance with a potential applied to the non-driving gate. Needless to say, the SIT is operable with the non-driving gate being floated, i.e. with the electrode 225 left open or even omitted.

It should be noted here that the drain region 213 and the source region 211 in FIGS. 2A and 2B are interchangeable with each other in their function. However, if this function exchange is required, it is generally preferable that the bottom ends of both the driving gate region 214 and the non-driving gate region 215 be elevated more apart in position from the top surface of the substrate 211 so to be used to serve as the drain region. This discussion is not limited to this embodiment alone, and same will apply to all other embodiments.

Figure 3A:
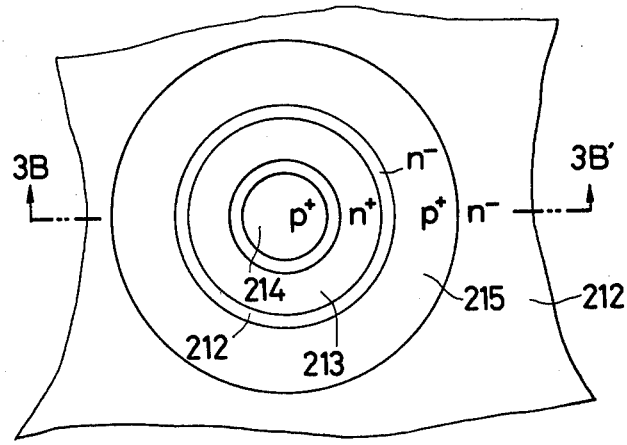
FIG. 3A shows an explanatory diagrammatic top plan view of an example of the SIT embodying the present invention.
Figure 3B:
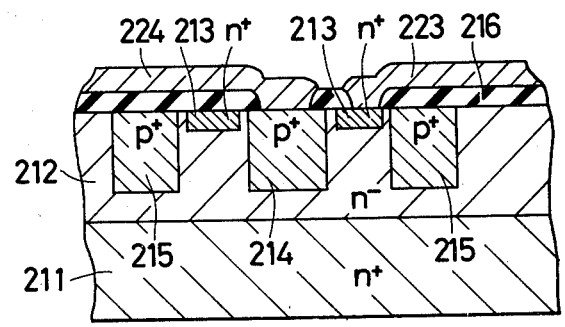
FIG. 3B is the diagrammatic vertical section, to be conceived as being taken along the line 3B–3B' in FIG. 3A.

Another embodiment of the present invention will be explained by referring to FIGS. 3A and 3B. FIG. 3A shows an explanatory diagrammatic top plan view of this embodiment, while FIG. 3B is a vertical section view taken along the line 3B–3B' in FIG. 3A. In this embodiment, the non-driving gate region 215 is formed so as to have a circular ring-like shape in plan view and positioned to surround the driving gate region 214. Therefore, a cylindrical or circular ring-like shape current channel is defined between the driving gate region 214 and the non-driving gate region 215, which face each other. The drain region 213 is also given a circular ring-like shape. The non-driving gate region 215 is floated, but it may be electrically connected to the source region 211. Needless to say, the non-driving gate region 215 may be provided with its electrode.

In the instant embodiment arrangement, the driving gate region 214 can face the entire area of the inner boundary of the cylindrical current channel region. Accordingly this arrangement is more effective to attain a higher transconductance as compared with the previous embodiment arrangement. Moreover, the dimension of the driving gate region 214 can be extremely minimized, while giving a required dimension for the current channel as well as the non-driving gate dimension. As such, it is possible to minimize the gate capacitance to a high degree, and therefore to attain a great increase in the operating speed of the SIT.

Figure 3C:
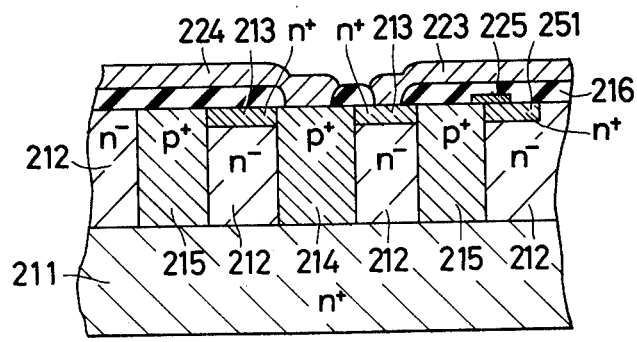
FIG. 3C is a diagrammatic vertical sectional view for illustrating a modification of the embodiment shown in FIGS. 3A and 3B.

A modification of the embodiment shown in FIGS. 3A and 3B is illustrated in vertical section in FIG. 3C, wherein both gate regions 214 and 215 extend to contact the source region (substrate) 211 and also the drain region 213. This modified arrangement is effective to further reduce the carrier storage effect in the SIT (see Japanese Patent application No. 51-147253 corresponding U.S. Ser. No. 854,494 filed on Nov. 23, 1977). In this FIG. 3C, the non-driving gate region 215 is shown as being electrically connected to the source region 211 by means of a heavily doped n+ type region 251, a metallic or low resitivity layer 225, and the layer 212. However, the region 215 may be floated.

FIGS. 4A through 4F are diagrammatic top plan views of different examples of multi-channel type.

Figure 4A:
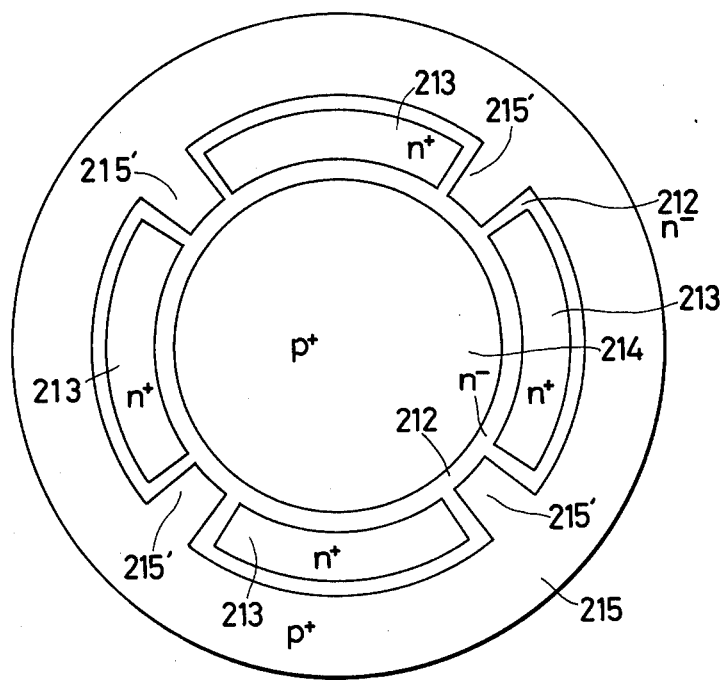

An example shown in FIG. 4A represents a modification or the previous embodiment of FIG. 3A, wherein there are provided four projections 215' extending inwardly from the circular ring-like shape non-driving gate region 215 near the centered driving gate region 214 so as to define four separated current channel regions between those gate regions 214 and 215. Consequently, four discrete drain regions 213 are provided for the respective current channels.

Figure 4B:
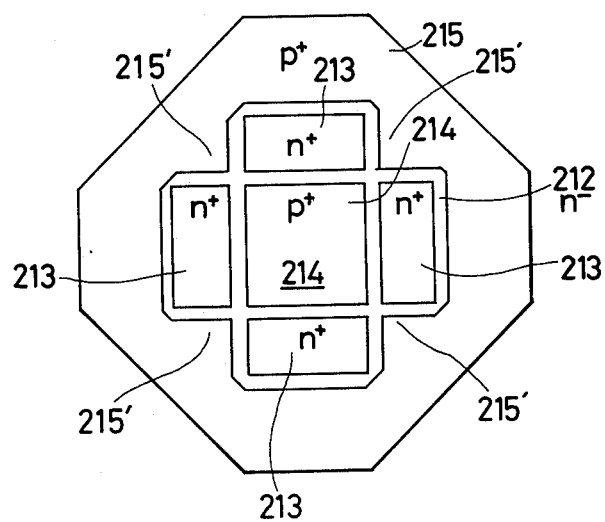

An embodiment shown in FIG. 4B represents a modification of the above-mentioned embodiment in FIG. 4A, and the non-driving gate region 215 is given an octagonal outline configuration in its top plan view.

Figure 4C:
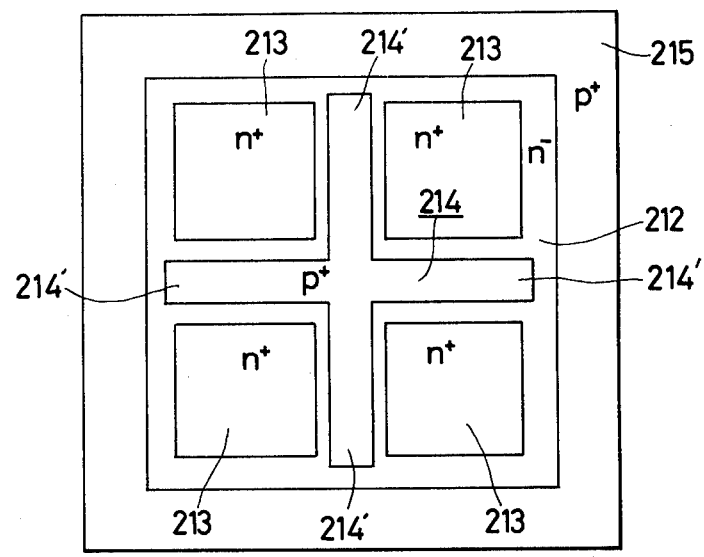

An embodiment shown in FIG. 4C is another modification of the embodiment illustrated in FIG. 4A, but the non-driving gate region 215 is shaped so as to have a square outline configuration in its top plan view, and also the driving gate region 214 is provided with four arm portions 214' extending outwardly from the center, in place of the projections 215' shown in FIG. 4A. Each pair of the neighboring two arm portions 214' jointly with the non-driving gate region 215 defines a current channel.

Figure 4D:
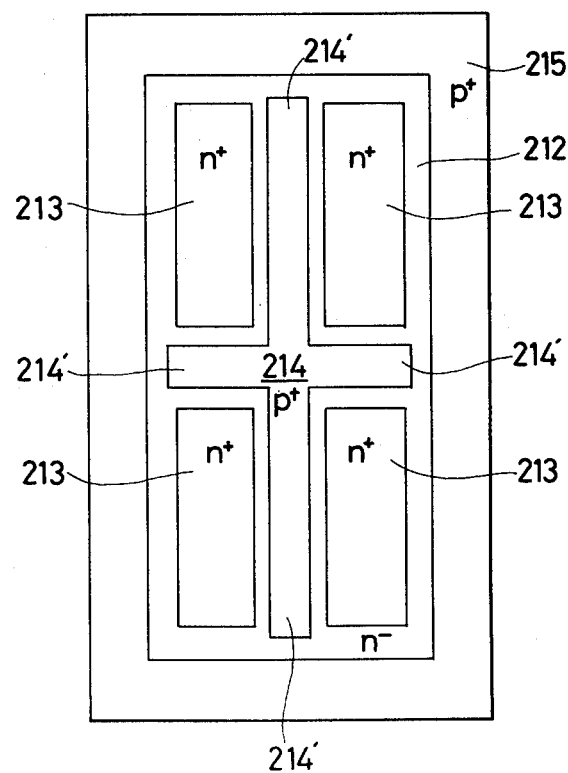

FIG. 4D illustrates a modification of FIG. 4C, and it is rectangular in its outline configuration. As long as the channel region between the long arm portion 214' and the non-driving gate region 215 can be pinched off, the channel area can be almost arbitrarily increased by elongating the vertical channel length in the Figure.

FIG. 4E shows a modified embodiment of FIG. 4D, wherein similar arrangements are integrated in series.

FIG. 4F shows a modification of the embodiment of FIG. 4E, and in this Figure the driving gate region 214 is formed into a straight bar-like shape in top plan view, while projections 215' are provided to extend from the non-driving gate region 215 in place of the arm portions 214' shown in FIG. 4F. In this embodiment, each of the current channel regions has an area which is only one third of its whole boundary area surrounded by the driving gate region 214, so that a further reduction in the gate capacitance can be attained.

Description will now be made of some other possible modifications of the driving gate arrangement, with reference made to FIGS. 5A, 5B and 5C.

Figure 5A:
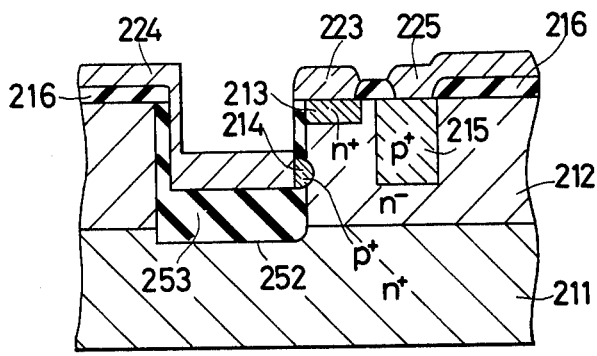
FIGS. 5A, 5B and 5C are diagrammatic vertical sectional views, respectively for showing other examples of the SIT embodying the present invention.

In FIG. 5A, the driving gate region 214 is provided at a side wall portion of a recess 252 formed in the layer 212 including also some portion of the substrate 211, in such a way as to protrude toward the non-driving gate region 215 through an insulator layer 253. In this arrangement, said driving gate region 214 can be readily formed into an extremely minute dimension by, for instance, applying the diffusion technique through an aperture opened in the side wall. As a result, together with the split-gate structure of the present invention, there can be obtained a great reduction in the gate capacitance.

Figure 5B:
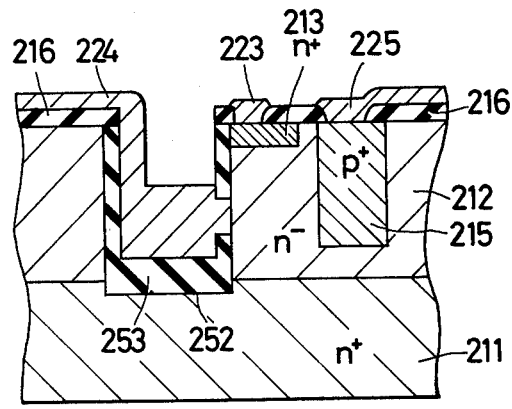

FIG. 5B illustrates an example wherein the driving gate is provided, in the form of a Schottky contact, by both the current channel region and a portion of the gate electrode 224 contacting thereto.

Figure 5C:
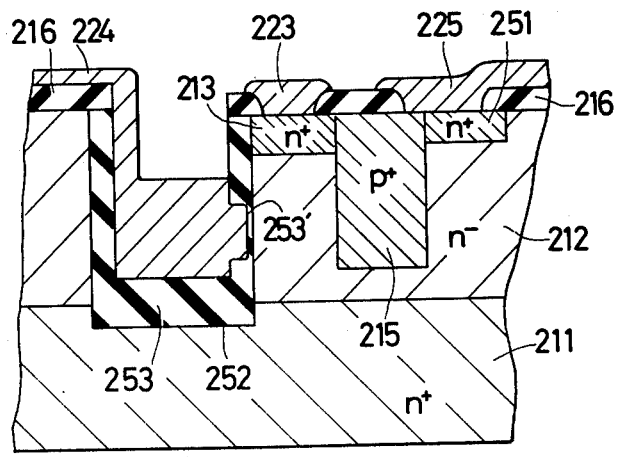

Another example is shown in FIG. 5C, wherein the driving gate is constructed in the form of a MIS (metal-insulator-semiconductor) structure or a MOS (metal-oxide-semiconductor) structure by a portion of the gate electrode 224, the current channel region, and a thin film portion 253' of the insulator layer 253.

Hereunder will be given description of some examples of IIL-type logic devices having improved gate structures according to the present invention.

Figure 6A:
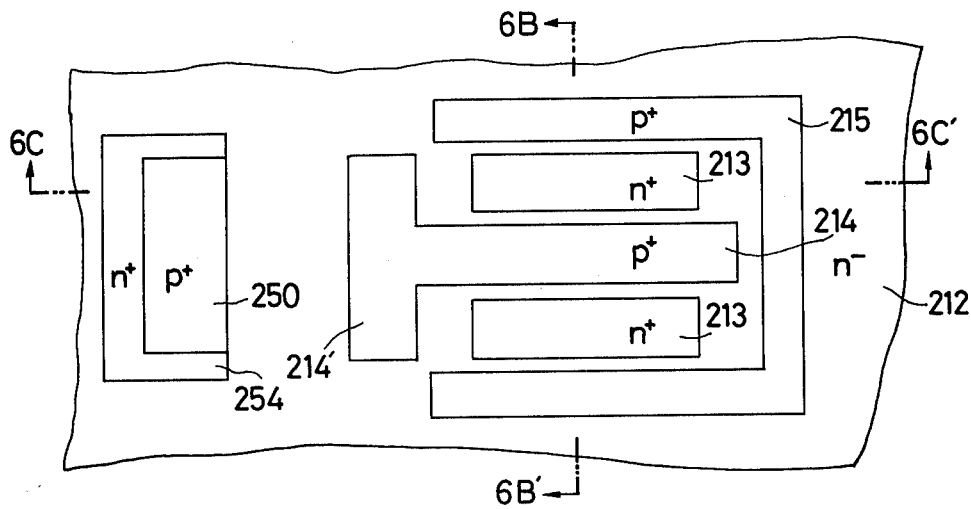
FIG. 6A shows an explanatory diagrammatic top plan view of an example of the IIL-type logic device according to the present invention.
Figure 6B:
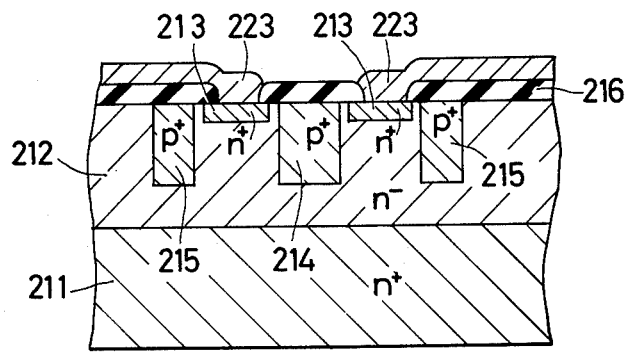
FIGS. 6B and 6C are vertical sections, to be conceived as being taken along the lines 6B–6B' and 6C–6C' in FIG. 6A, respectively.
Figure 6C:
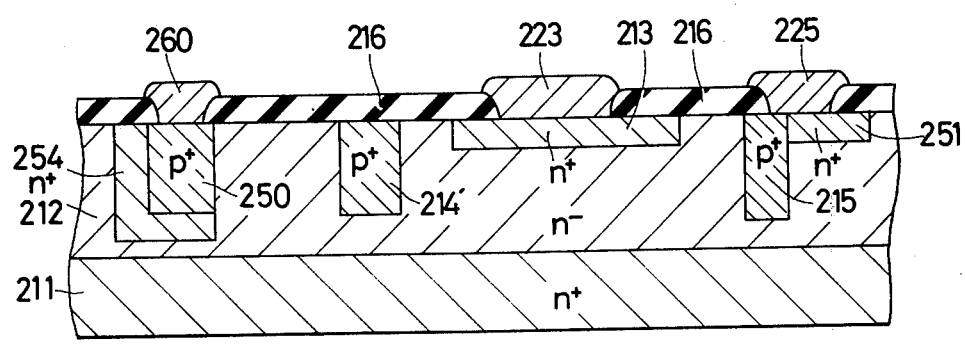

FIG. 6A shows a diagrammatic partially broken-away top plan view of an example of the logic device embodying the present invention, and FIGS. 6B and 6C are diagrammatic explanatory vertical sectional views taken along the lines 6B–6B' and 6C–6C' in FIG. 6A, respectively. This device includes a two-channel SIT serving as the driver transistor and a bipolar transistor serving as the injector transistor. The driver SIT is substantially equivalent to the SIT of FIG. 4D, being halved along its horizontal center line of FIG. 4D. The injector transistor is comprised of a heavily doped p+ type region 250 (serving as the emitter region), an outwardly extending portion 214' of the driving gate region 214 (to serve as the collector region), and a portion of the layer 212 located between the two regions (to serve as the base region). In this example, there is provided a heavily doped n+ region 254 for preventing undesirable carrier injection from the emitter in other directions than toward the collector region 214' to thereby increase the carrier injection efficiency between the emitter and the collector. Reference numeral 260 represents an ohmic contact electrode for the emitter region 250. This example is capable of making switching operation at a high speed, because of the reduced gate capacitance and the reduced carrier storage effect of the driver SIT having the split-gate structure according to the present invention.

Figure 7A:
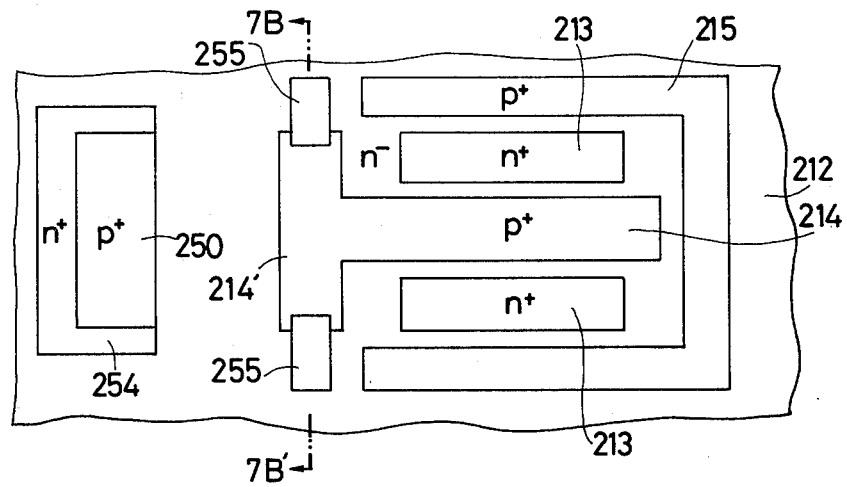
FIG. 7A is an explanatory diagrammatic top plan view of a modification of the embodiment shown in FIGS. 6A, 6B and 6C.
Figure 7B:
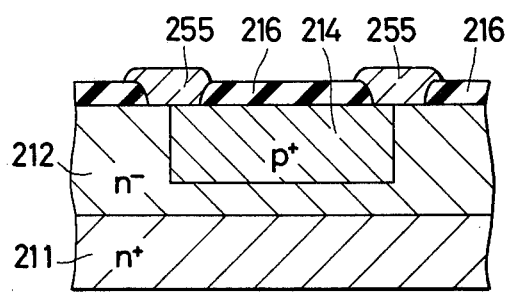
FIG. 7B is a vertical section, to be conceived as being taken along the line 7B–7B' in FIG. 7A.

A modification of the above-described embodiment is shown in top plan view in FIG. 7A, and its vertical sectional view taken along the line 7B–7B' in FIG. 7A is illustrated in FIG. 7B. In this embodiment, there is additionally provided metallic electrodes 255 contacting both the collector or driving gate region 214' and the layer 212, thus forming two Schottky diodes across the driving gate region 214 and the source region 211 (see FIG. 7B). When the potential of the driving gate region 214 exceeds a certain potential required for an adequate amount of carriers to be injected from the driving gate region 214 into the current channel regions, these Schottky diodes turn to the conducting state to bypass therethrough the excessive carriers so that the possibility of carrier storage effect in the driver SIT is further effectively prevented.

Figure 7C:
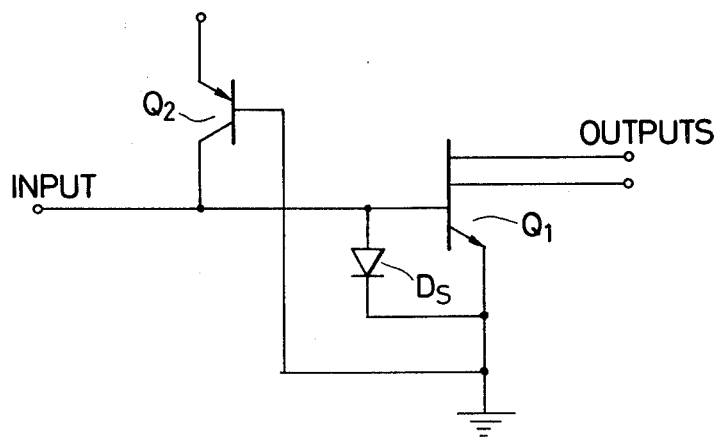
FIG. 7C is a circuit diagram showing the equivalent circuit for the embodiment of FIGS. 7A and 7B.

In FIG. 7C is shown an equivalent circuit diagram for the device of FIGS. 7A and 7B, wherein the aforementioned Schottky diodes are generally represented at $D_s$.

Figure 8:
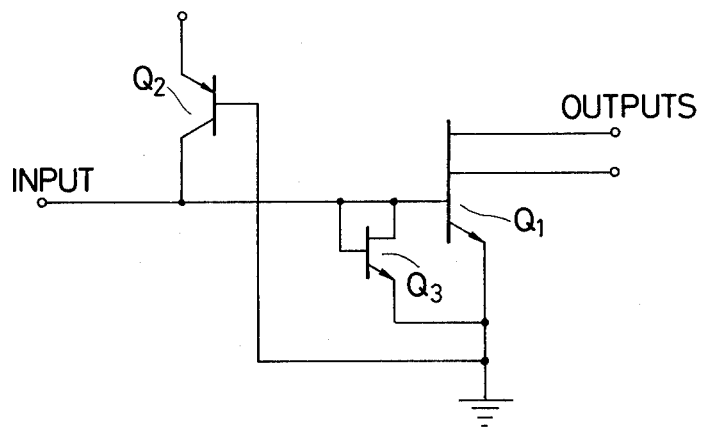
FIG. 8 is a circuit diagram for explaining a modification of the embodiment shown in FIGS. 7A through 7C.

Alternatively, the same effect as that exerted by the Schottky diodes can be attained by shunting the driving gate to the source of the driver SIT by means of an SIT having its gate connected to the drain, as shown in FIG. 8. Such additional SIT $Q_3$ may be obtained easily by modifying the driver SIT $Q_1$ in such a way that one of the drains of the SIT is connected to the driving gate. In such case, one of the current channels associated with the gate-coupled drain may preferably be given a somewhat smaller width than that of the other current channels.

Figure 9A:
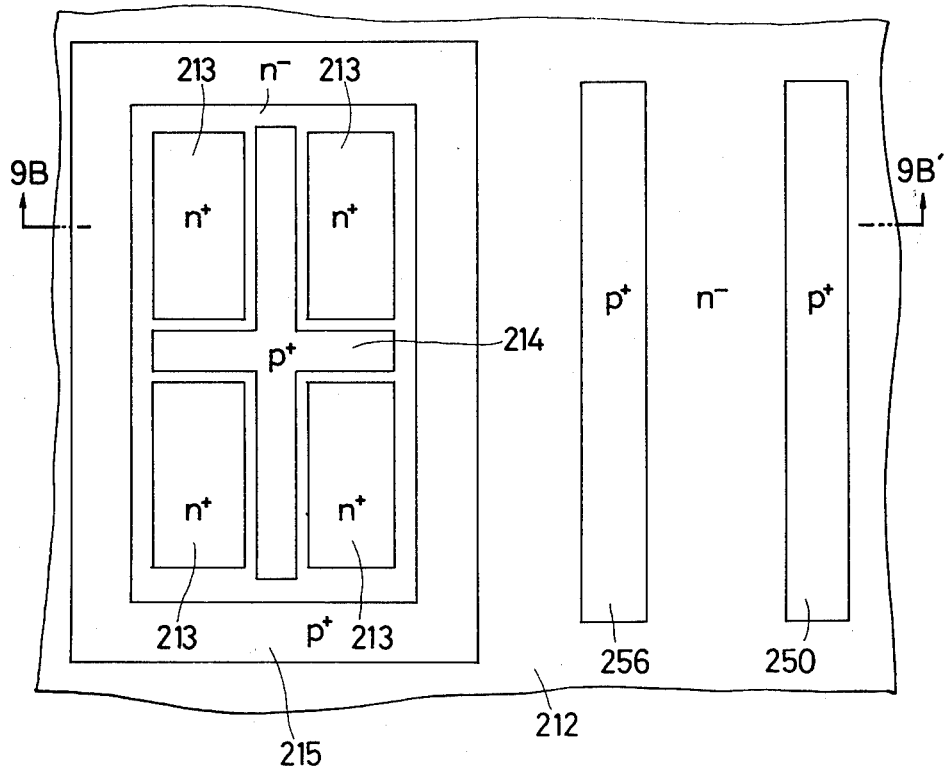
FIG. 9A is an explanatory diagrammatic top plan view of an example of the IIL-type logic device according to the present invention.
Figure 9B:
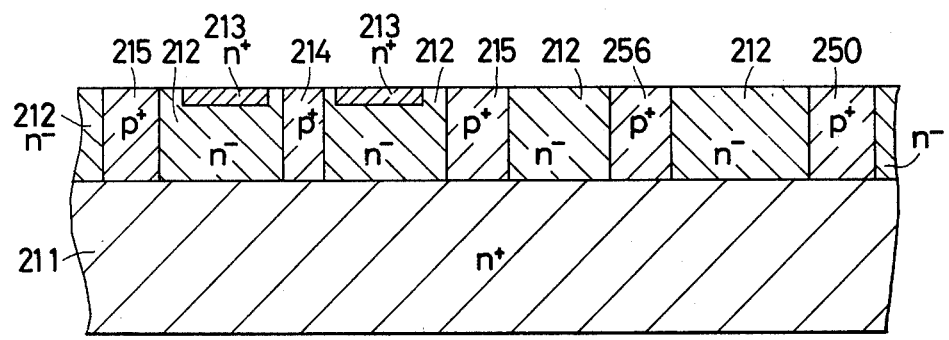
FIG. 9B is a diagrammatic vertical section taken along the line 9B–9B' in FIG. 9A.

Another example of the IIL-type logic device having an improved gate structure embodying the present invention is shown in top plan view in FIG. 9A and also shown in FIG. 9B in vertical section taken along the line 9B–9B' in FIG. 9A. In this embodiment, the driver SIT is of the same arrangement as that of the SIT shown in FIG. 4D, while the collector of the injector transistor is formed by a heavily doped p+ type region 256 provided separately from the driving gate region 214 of the driver transistor at a site outside the non-driving gate region 215. The collector region 256, however, is wired to the driving gate region 214 by a conducting material (not shown). This arrangement may not bring about higher integration density as compared with the previous embodiment explained in FIG. 6A due to the distance between the non-driving gate region 215 and the separated collector region 256. Actually, the distance between said non-driving gate region 215 and the separated collector region 256 requires to be such as to be sufficient for preventing the ocurrence of a punch-through phenomenon between the collector region 256 and the non-driving gate region 215. However, this distance can be sufficiently minimized by the provision of a relatively high impurity concentration region or a suitable insulator layer between those two regions 214 and 256. Accordingly, a reduction in the integration density can be achieved to an acceptable level. Additionally speaking, the heavily-doped inserting region preferably is located near the non-driving gate region at a site as far apart as possible from the collector region for the purpose of preventing an increase in the collector capacitance.

Figure 10:
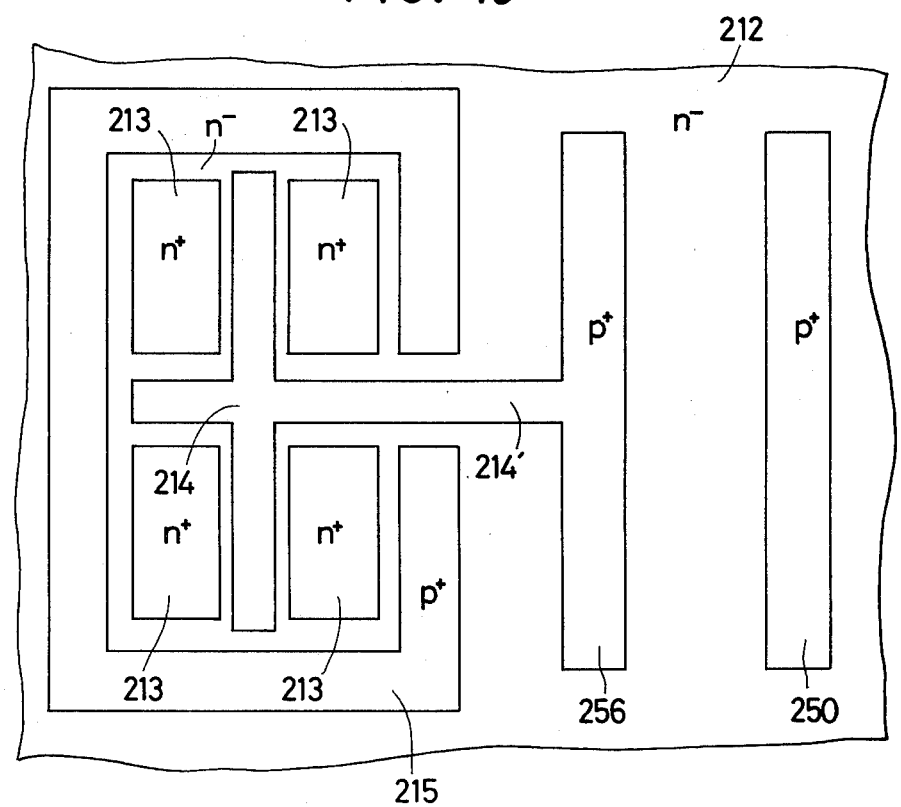
FIG. 10 is a diagrammatic top plan view for illustrating a modification of the embodiment shown in FIGS. 9A and 9B.

FIG. 10 shows a modification of the preceding embodiment illustrated in FIG. 9A, and in this instant example the collector region 256 is merged into the driving gate region 214 through a horizontally elongated portion 214' extending from the driving gate 214 through a cut-out portion of the non-driving gate region 215. This arrangement advantageously allows the omission of wiring between the collector region and the driving gate region.

Figure 11A:
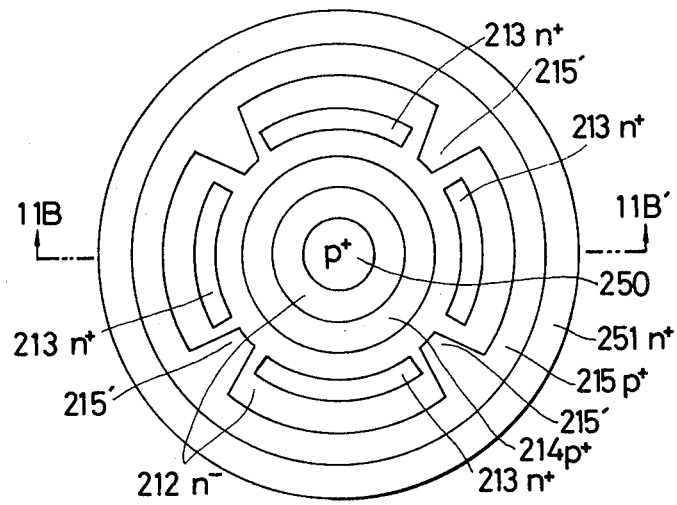
FIG. 11A is a diagrammatic top plan view of an example of the IIL-type logic device according to the present invention.
Figure 11B:
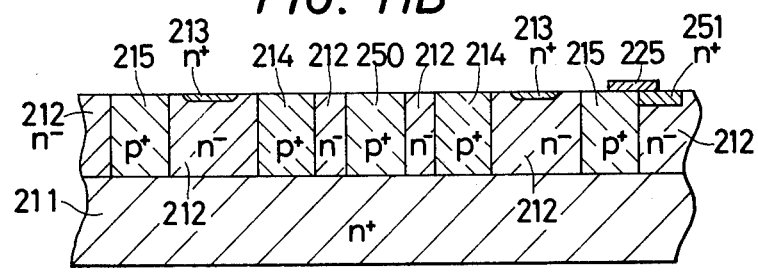
FIG. 11B is a diagrammatic vertical section taken along the line 11B–11B' in FIG. 11A.

A more preferable example of the IIL-type logic device according to the present invention is illustrated in FIGS. 11A and 11B. In this embodiment, the driver SIT is formed in a structure generally similar to that of the SIT shown in FIG. 4A, as will be readily seen from the top plan view of FIG. 11A as well as from the vertical sectional view of FIG. 11B taken along the line 11B–11B' in FIG. 11A. However, the driving gate 214 is modified to have a circular ring-like shape. On the other hand, the injector transistor is designed so that its emitter region 250 is located inside the circular driving gate region 214 but separated from the driving gate region. As will be apparent, the collector region of the injector transistor is merged into the driving gate region 214. With this instant arrangement, the following advantages are obtained. That is, the overall dimension of the unit device as a whole including one set of the driver and injector transistors can be easily minimized. Moreover, since the non-driving gate region 215 functions as a separation region between neighboring unit devices, the respective unit devices can be provided at sites closely adjacent to each other without the provision of any intervening particular isolation regions. Thus, a higher integration density is possible without particular difficulty. Furthermore, because the emitter region is completely surrounded by the collector region, an extremely high injection efficiency of carriers from the emitter region to the collector or driving gate region contributes to a substantial reduction in the power dissipation of the device.

Figure 11C:
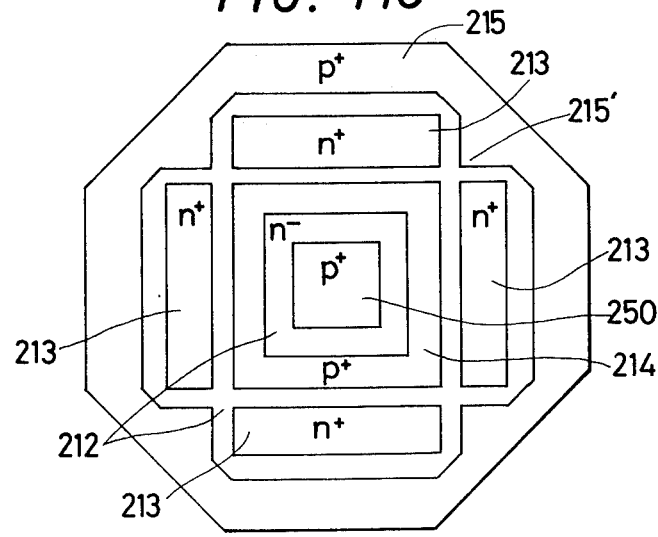
FIG. 11C is a diagrammatic top plan view for illustrating a modification of the embodiment shown in FIGS. 11A and 11B.

FIG. 11C is shown in top plan view, a modification of the embodiment of FIG. 11A. In this example, the driver SIT is substantially the same in the general arrangement as the SIT shown in FIG. 4B, but a change is noted in that the driving gate region 214 surrounds the emitter region 250.

Figure 12A:
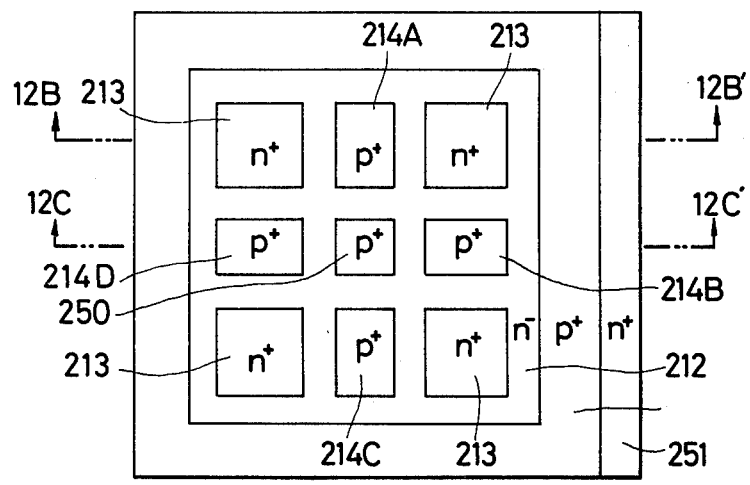
FIG. 12A is an explanatory diagrammatic top plan view of an example of the IIL-type logic device according to the present invention.
Figure 12B:
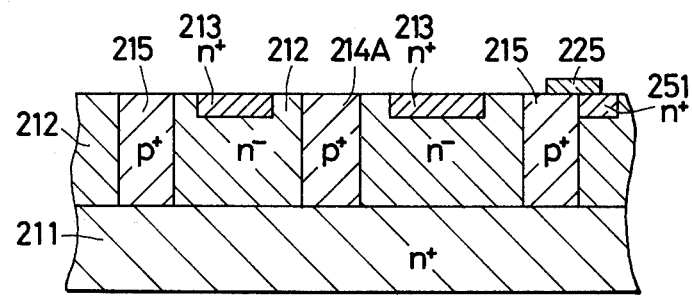
FIGS. 12B and 12C are diagrammatic vertical sections taken along the lines 12B–12B' and 12C–12C' in FIG. 12A, respectively.
Figure 12C:
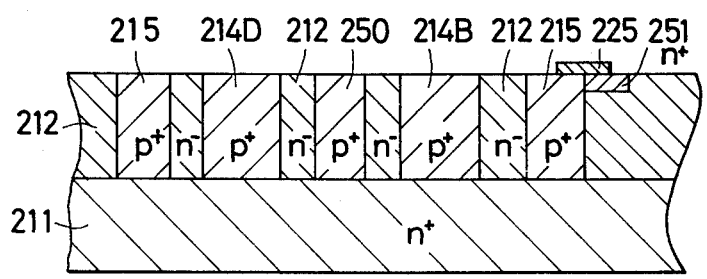

FIG. 12A shows the top plan view of another example of the IIL-type logic device embodying the present invention, and FIGS. 12B and 12C are vertical sectional views taken along the lines 12B–12B' and 12C–12C', respectively. In this embodiment, the driver SIT is formed in an arrangement similar to that of the SIT shown in FIG. 4C, but its driving gate region is divided into four separate regions 214A through 214D. The respective driving gate regions 214A through 214D are wired in common, and define four separate current channel regions in the layer 212 between these regions and the non-driving gate region 214. The emitter region 250 of the injector transistor is located at the central portion of the unit device and accordingly it is surrounded by the respective driving gate regions 214A through 214D.

It should be noted that any one set of opposing two regions 214B and 214D or regions 214A and 214C may, if required, be used as non-driving gate regions, either in the form of being floated or being held at a certain potential. In this case, those regions for the non-driving gate regions may preferably be separated from the emitter region 250 by insulator regions or relatively heavily doped n+ type regions to prevent a undesirable injection of carriers from the emitter region 250. This concept may be applied also in the following embodiment.

Figure 13A:
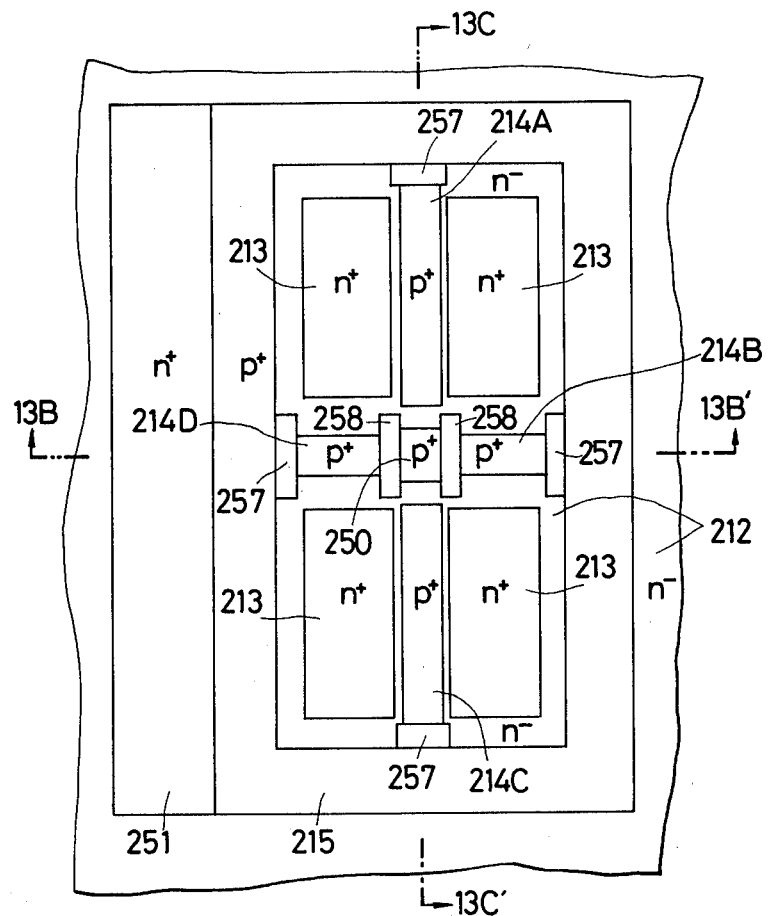
FIG. 13A is an explanatory diagrammatic top plan view of an example of the IIL-type logic device according to the present invention.
Figure 13B:
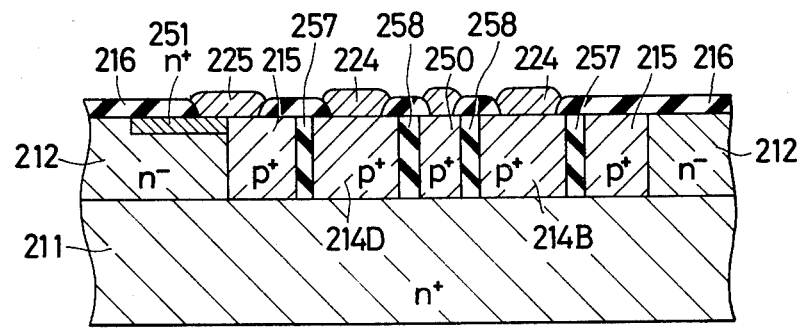
FIGS. 13B and 13C are vertical sections, to be conceived as being taken along the lines 13B–13B' and 13C–13C' in FIG. 13A, respectively.
Figure 13C:
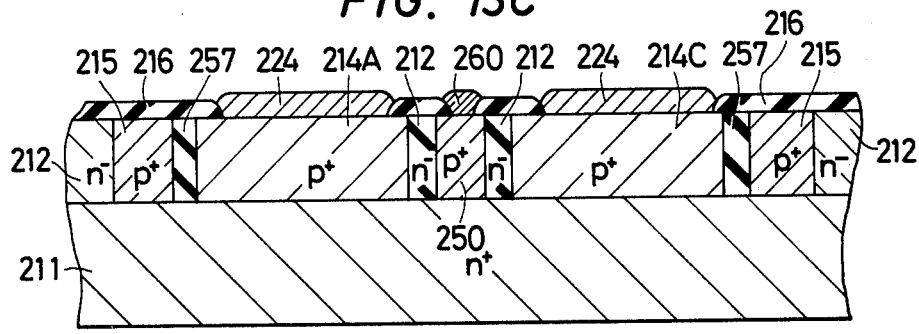

An embodiment of the IIL-type logic device of the present invention is shown in top plan view in FIG. 13A, and its vertical sectional views taken along the lines 13B–13B' and 13C–13C' are illustrated in FIGS. 13B and 13C, respectively. In this embodiment, the driving gate is divided into four regions 214A to 214D. These regions 214A through 214D are adapted to be wired together. The two regions 214B and 214D are separated by insertion regions 212 of an insulator material such as $SiO_2$, $Si_3N_4$ or $Al_2O_3$, for preventing punch-through between the emitter region 250 and the drain regions 213. Furthermore, the driving gate regions 214A through 214D are separated from the non-driving gate region 215 by insertion regions 257 of an insulator material such as those listed above, for the purpose of preventing the occurrence of punch-through between those regions. Needless to say, the above-mentioned insertion regions 257 may be replaced by relatively heavily-doped n type regions.

Figure 14A:
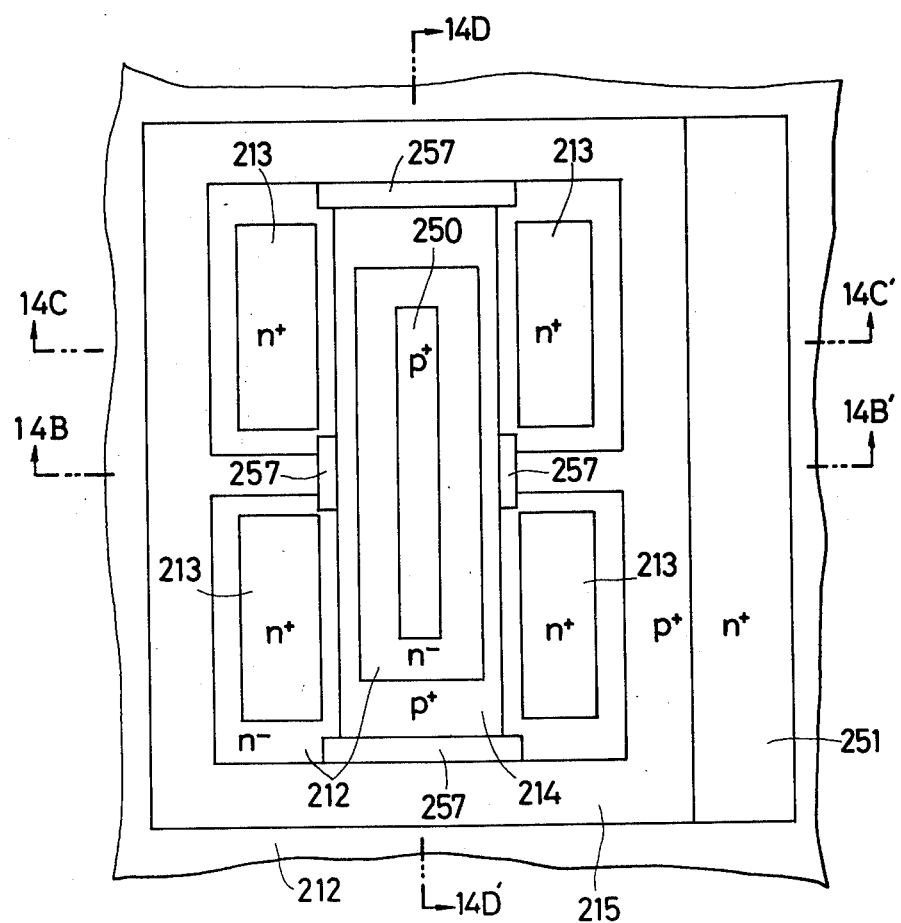
FIG. 14A is an explanatory diagrammatic top plan view of an example of the IIL-type logic device according to the present invention.
Figure 14B:
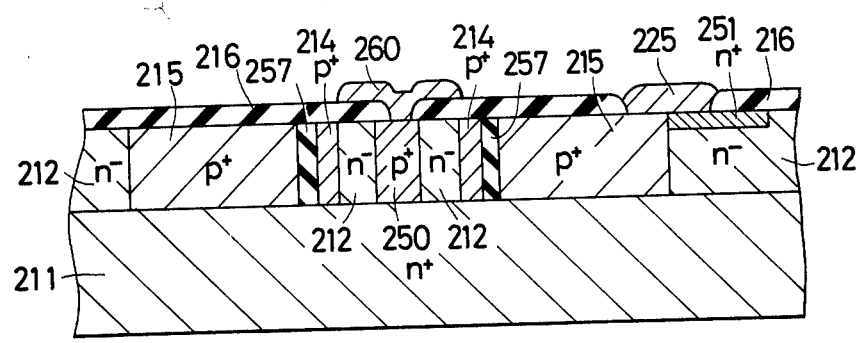
FIGS. 14B, 14C and 14D are diagrammatic vertical sections, to be conceived as being taken along the lines 14B–14B', 14C–14C' and 14D–14D' in FIG. 14A, respectively.
Figure 14C:
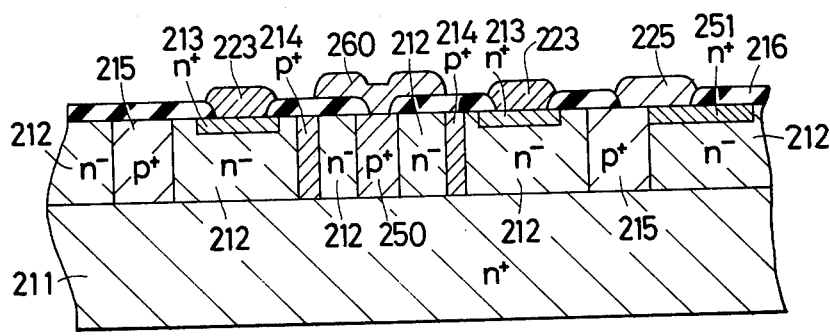
Figure 14D:
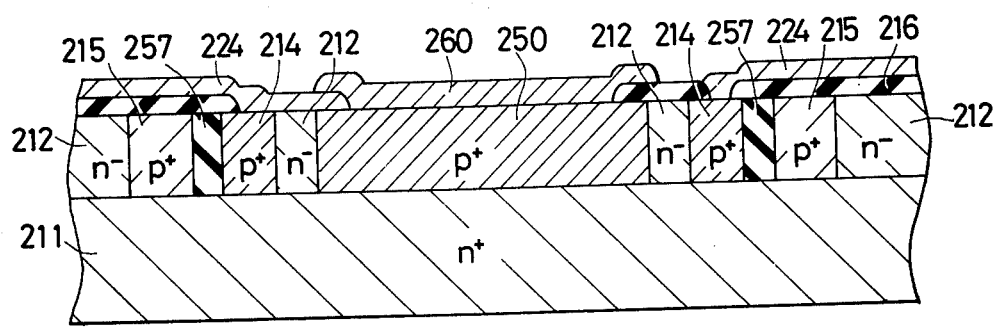

Another modification of the embodiment shown in FIG. 11A is illustrated in top plan view in FIG. 14A, and its vertical sectional views taken along the lines 14B–14B', 14C–14C' and 14D–14D' are shown in FIGS. 14B, 14C and 14D, respectively. In this embodiment, however, both the driving gate region 214 and the non-driving gate region 215 are formed in an almost rectangular outline configuration which is substantially similar to that in FIG. 4F. The driving gate region 214 is separated by insertion regions 257 of an insulator material or by a relatively heavily doped n type semiconductor material.

Figure 15A:
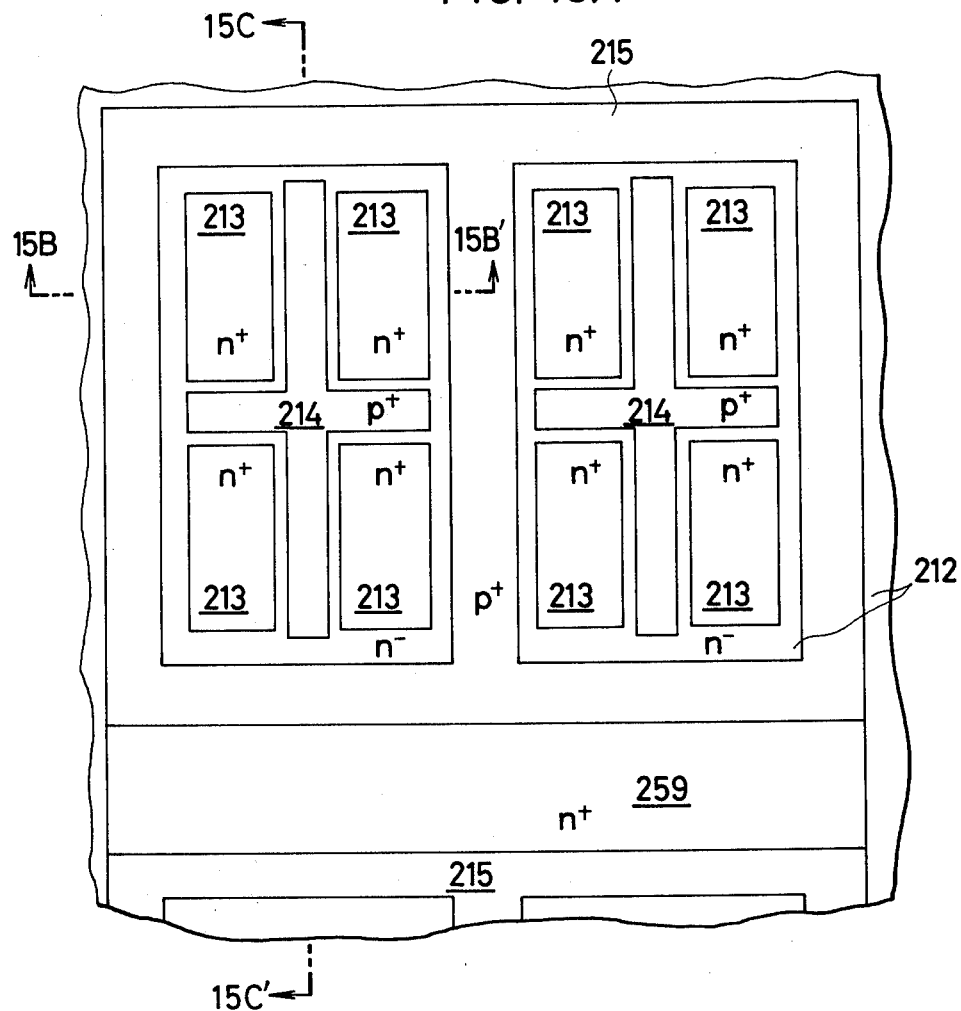
FIG. 15A is an explanatory diagrammatic top plan view of an example of the IIL-type logic device according to the present invention.
Figure 15B:
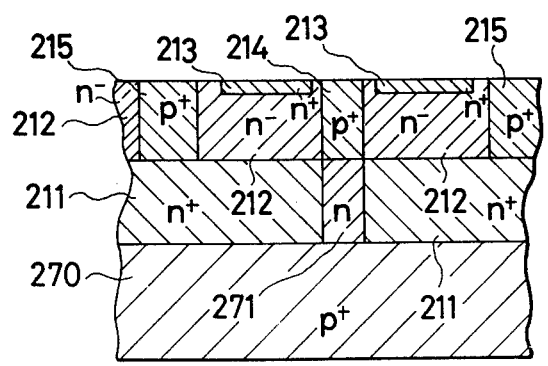
FIGS. 15B and 15C are diagrammatic vertical sections taken along the lines 15B–15B' and 15C–15C' in FIG. 15A, respectively.
Figure 15C:
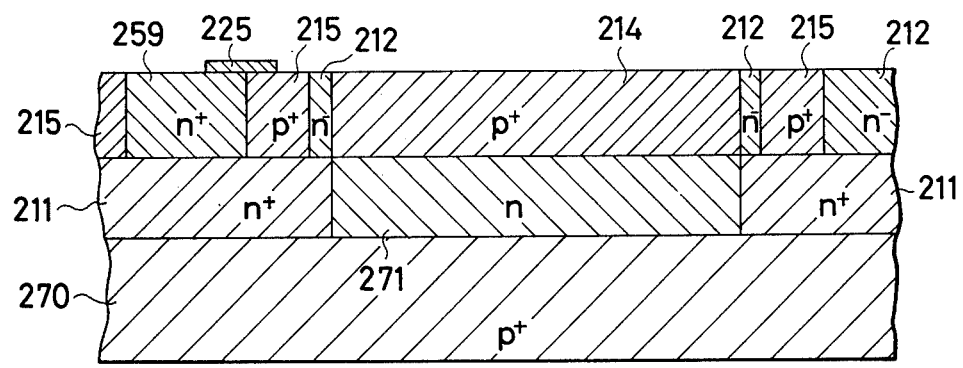

Another embodiment is shown in top plan view in FIG. 15A, and its vertical sectional views taken along the lines 15B–15B' and 15C–15C' of FIG. 15A are illustrated in FIGS. 15B and 15C, respectively. This embodiment of the IIL-type logic device is comprised of a driver SIT having substantially the same arrangement as that in FIG. 9A, and an injector bipolar transistor of vertical structure formed under this driver SIT. More particularly, the injector transistor includes a heavily doped p+ type semiconductor layer or substrate 270 (emitter region) formed beneath the n+ type layer 211, relatively lightly-doped n type region 271 (base region) formed in the layer 113 beneath the driving gate region 214, and having an impurity concentration ranging from $10^{13}$ to $10^{16}$ atoms/cm$^3$, and the region 214 (collector region merged into the driving gate region). Since the diffusion potential induced at the boundary between the regions 270 and 271 is lower than that induced at the boundary between the regions 211 and 270, the injection of carriers from the region 270 will take place almost exclusively into the base region 271. A heavily doped n+ type region 259 is provided for leading the source region 211 to the upper side of the device. The non-driving gate region 215 is connected to the region 259 by a conducting layer or electrode 225 for holding itself at the same potential as that of the source region 211, but the non-driving gate region 215 may be floated, if required.

This embodiment allows a higher density of integration as compared with the previous embodiments explained by referring to FIGS. 6A through 14D, because it contains an injector bipolar transistor of a vertical structure formed under the driving gate, while the previous embodiments include the injector transistor of a lateral structure. Needless to say, the base region 271 can be easily formed by relying on the conventional selective diffusion technique, ion implantation technique or vapor growth technique, for instance, and therefore this embodiment is easy to manufacture.

Figure 15D:
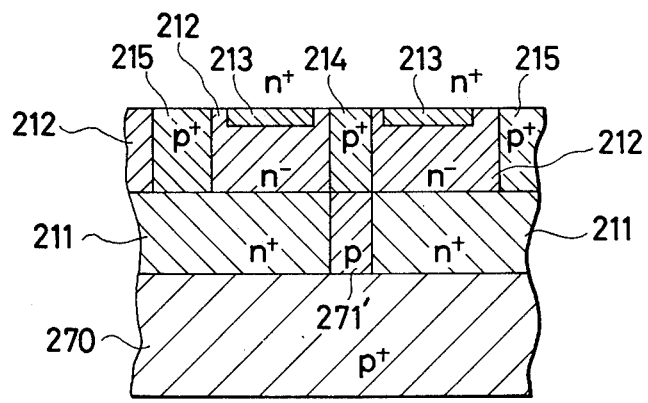
FIG. 15D is a diagrammatic vertical sectional view for illustrating a modification of the embodiment shown in FIGS. 15A, 15B and 15C.
Figure 15E:
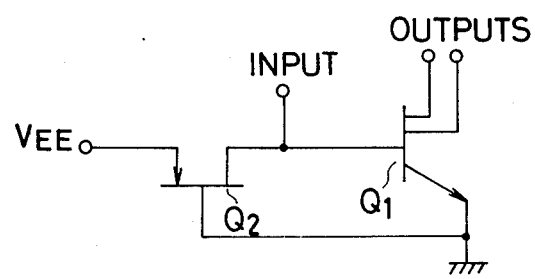
FIG. 15E is a circuit diagram illustrating the equivalent circuit for the embodiment shown in FIG. 15D.

A modification of the above-mentioned embodiment of FIGS. 15A to 15C is shown in vertical section in FIG. 15D. In this example, the base region 271 in FIG. 15B is replaced by a relatively lightly-doped p type region 271' having an impurity concentration selected between $10^{13}$ and $10^{16}$ atoms/cm$^3$. In this embodiment, a vertical-type p-channel field effect transistor is used as the injector transistor, as shown in an equivalent circuit diagram in FIG. 15E. The injector field effect transistor is constituted by the region 270 (source region), the region 271' (current channel region), the region 214 (drain region merged into the driving gate region of the driver SIT), and a region 211 (gate region merged into the source region of the driver SIT). As compared with the embodiment of FIGS. 15A to 15C a higher efficiency of carrier injection is accomplished from the region 270 into the current channel region 271'. Since the diffusion potential between the regions 270 and 271' is low, a larger current is allowed to flow as compared to the bipolar injector transistor in FIGS. 15A to 15C under the same conditions. This leads to a higher speed switching operation.

Figure 16A:
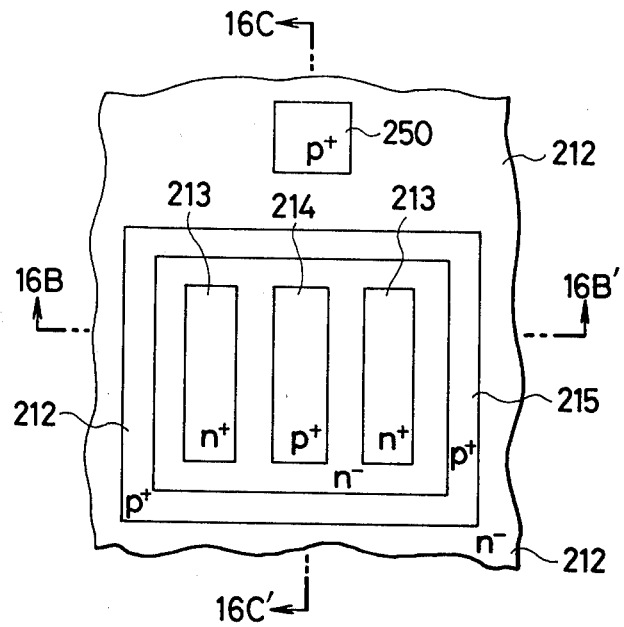
FIG. 16A is an explanatory diagrammatic top plan view of an example of the IIL-type logic device according to the present invention.
Figure 16B:
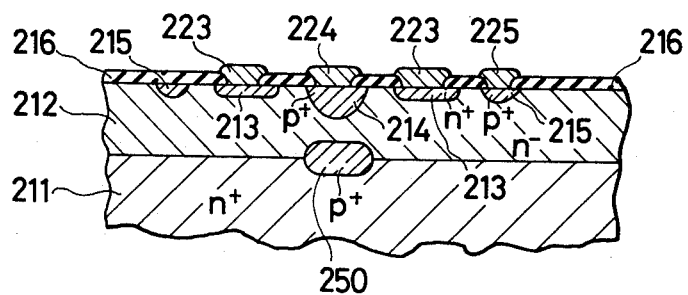
FIGS. 16B and 16C are diagrammatic vertical sections, to be conceived as being taken along the lines 16B–16B' and 16C–16C' in FIG. 16A, respectively.
Figure 16C:
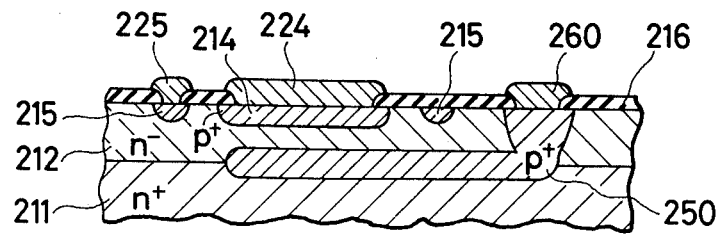

FIG. 16A is a top plan view of an embodiment of the present invention, and FIGS. 16B and 16C are vertical sections taken along the lines 16B–16B' and 16C–16C' of FIG. 16A, respectively. In this embodiment, the injector transistor is comprised of a bipolar transistor of a vertical structure, and is constructed by a heavily-doped p+ type region 250 embedded under the driving gate region 214 (emitter region), the region 214 (collector region merged into the driving gate region of the driver SIT) and a portion of the layer 212 sandwiched between the emitter and collector regions (base region). A portion of the emitter region 250 is extended vertically upwardly to an upper surface portion of the layer 212 outside the non-driving gate region 215, and contacts an electrode 260. This arrangement has the advantage that any particular wiring crossing over the non-driving gate region 215 is not required for the emitter region 250.

Figure 17:
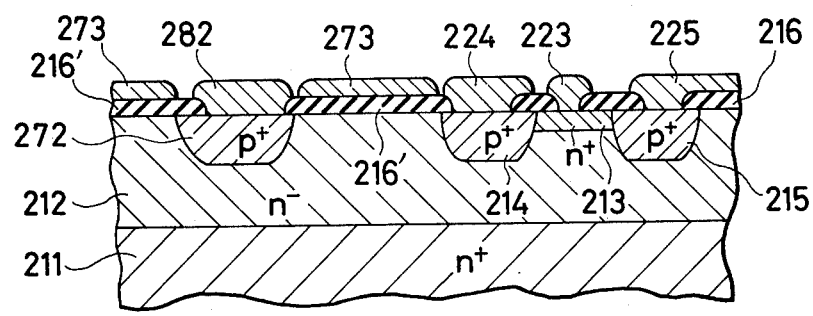
FIG. 17 is a diagrammatic vertical sectional view for illustrating an example of the IIL-type logic device according to the present invention.

In the aforementioned respective examples of the IIL-type logic devices having improved gate structures according to the present invention, the injector transistor may be replaced by a MOS or MIS type field effect transistor. Such arrangement is employed in an embodiment shown in vertical section in FIG. 17, wherein a MOS or MIS type field effect transistor to serve as the injector is constituted by the p+ type region 272 (source region), the p+ type region 214 (drain region merged into the driving gate region of the driver SIT), a metallic or polycrystalline electrode 273 (gate electrode) deposited, via a thin film of an oxide or insulator material 216', on the upper surface of the layer 212 between the regions 214 and 272, and an induced current channel region (an inversion layer) in the layer 212 under the electrode 273. Carriers of an amount according to a potential applied to the gate electrode 273 are injected through the induced current channel region into the drain (driving gate) region 214. It should be noted here that the drain and channel regions may be formed in a cylindrical shape as shown in FIG. 11A.

Figure 18A:
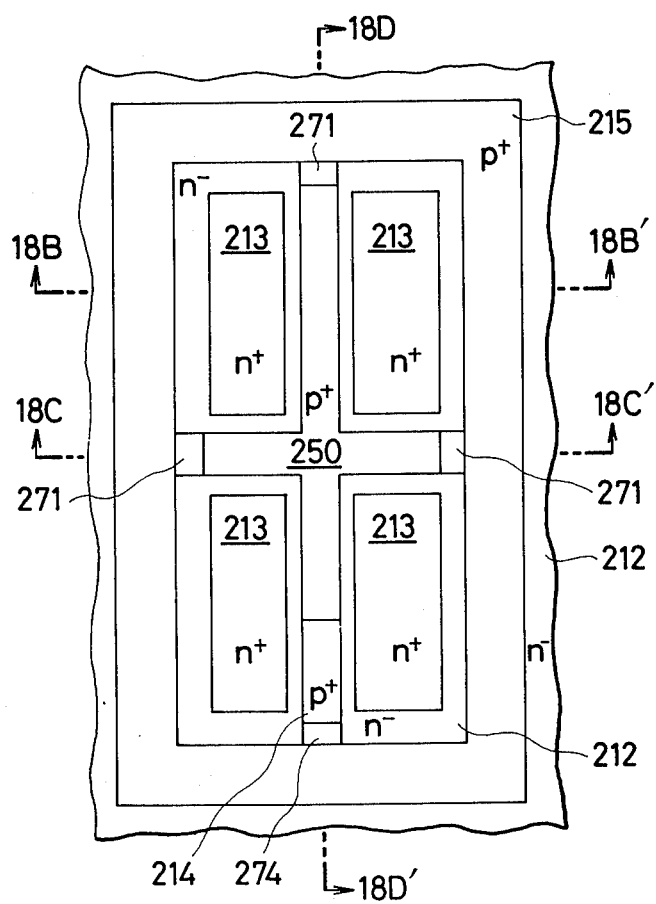
FIG. 18A is an explanatory diagrammatic top plan view of an example of the IIL-type logic device according to the present invention.
Figure 18B:
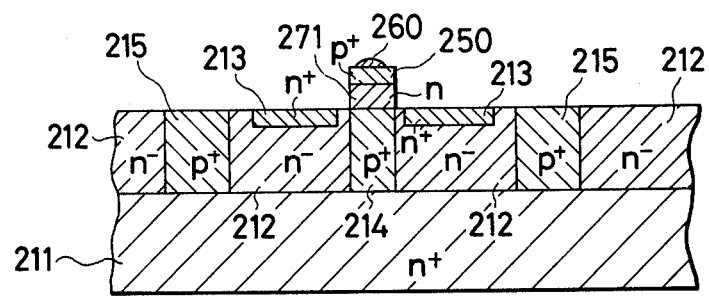
FIGS. 18B through 18D are diagrammatic vertical sections taken along the lines 18B–18B', 18C–18C' and 18D–18D' in FIG. 18A, respectively.
Figure 18C:
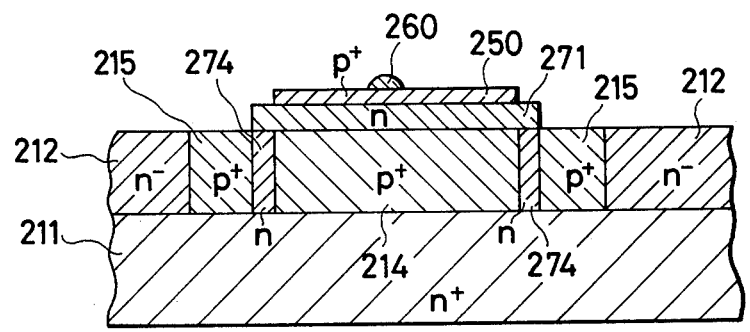
Figure 18D:
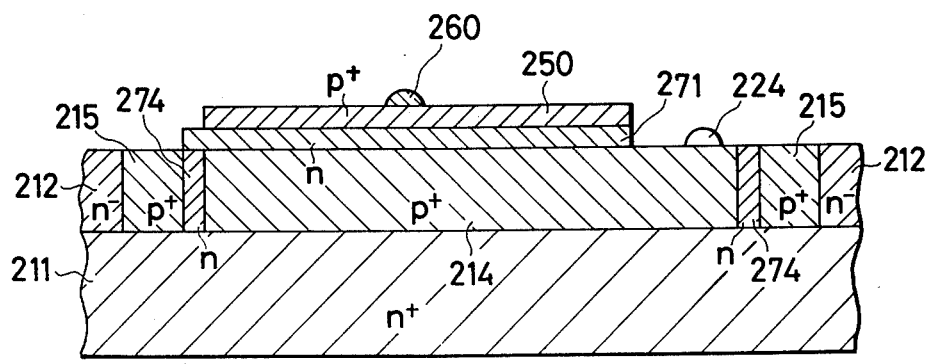

Another example of the IIL-type logic device embodying the present invention is shown in top plan view in FIG. 18A, and its vertical sections taken along the lines 18B–18B', 18C–18C' and 18D–18D' in FIG. 18A are shown in FIGS. 18B, 18C and 18D, respectively. In this arrangement, the driver SIT is of the same arrangement as that in FIG. 4D. Whereas, a bipolar transistor to serve as the injector is formed by the p+ type region 214 (collector region merged into the driving gate region of the driver SIT), a relatively lightly-doped n type region 271 (base region) deposited on the collector (driving gate) region 214, and a heavily-doped p+ type region 250 (emitter region) deposited on the base region 271. The n or n+ type regions 274, which are provided for preventing the occurrence of punch-through between the driving gate region 214 and the non-driving gate region 215, may be replaced by insulator layers.

Figure 19A:
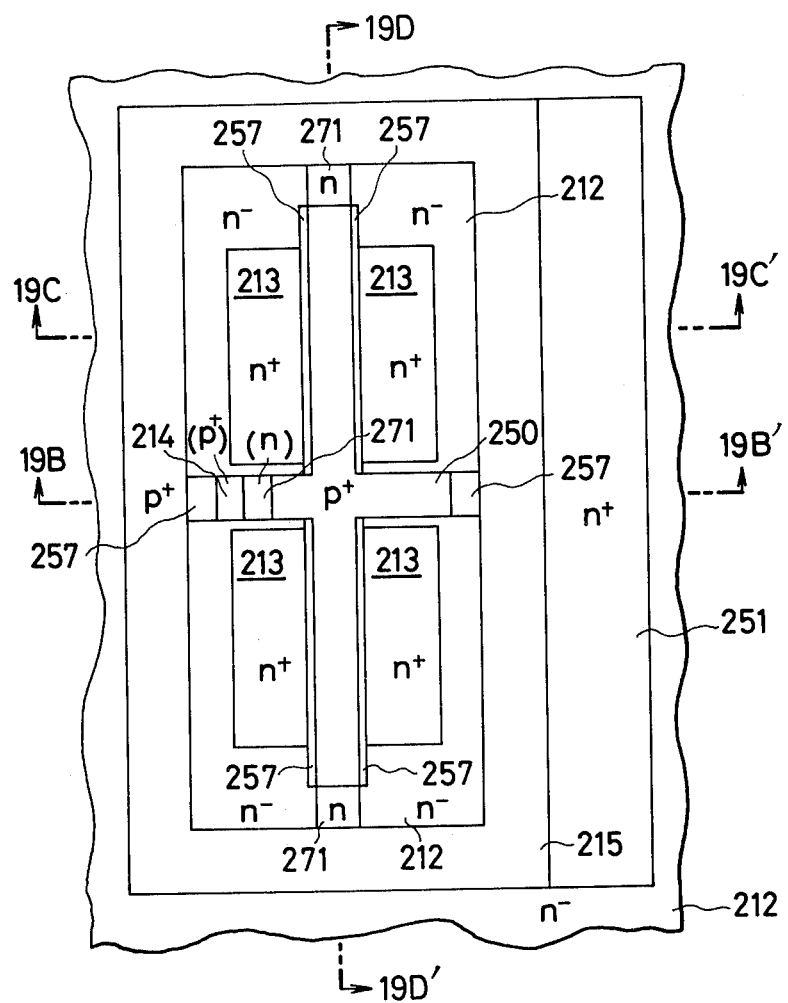
FIG. 19A is an explanatory diagrammatic top plan view of an example of the IIL-type logic device according to the present invention.
Figure 19B:
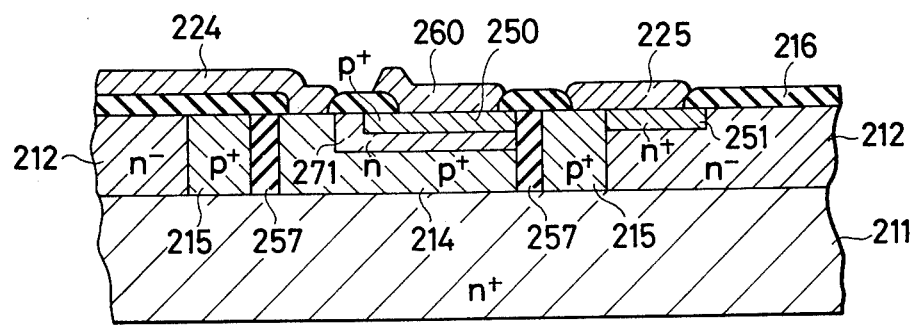
FIGS. 19B, 19C and 19D are diagrammatic vertical sectional views, to be conceived as being taken along the lines 19B–19B', 19C–19C' and 19D–19D' in FIG. 19A, respectively.
Figure 19C:
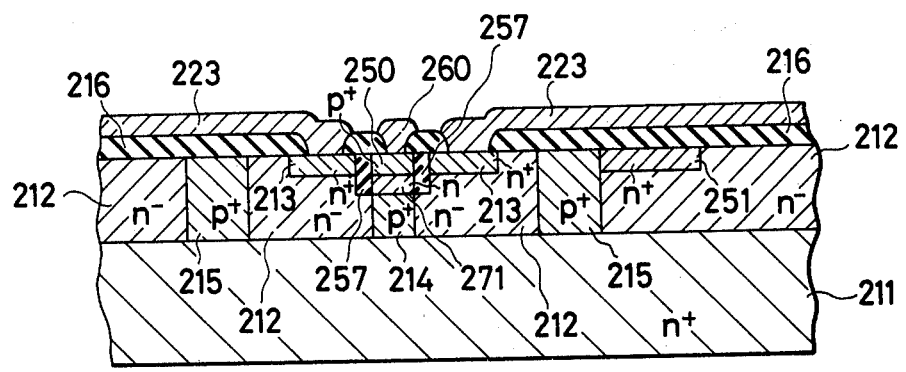
Figure 19D:
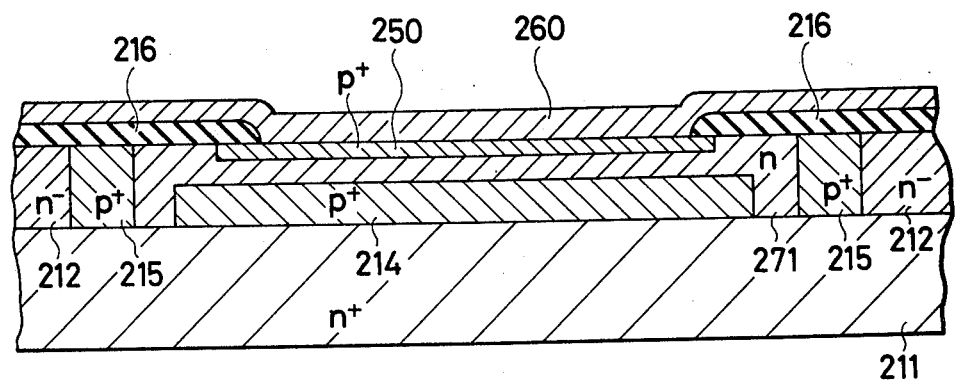

A modification of the above-mentioned embodiment is shown in top plan view in FIG. 19A, and its vertical sectional views taken along the lines 19B–19B', 19C–19C' and 19D–19D' in FIG. 19A are shown in FIGS. 19B, 19C and 19D, respectively. In this embodiment, the injector transistor is formed in the layer 212, and the emitter region 250 is formed coplanar with the upper surface of the layer 212. Other arrangements are similar to those shown in FIGS. 18A through 18D.

A brief description of a basic concept and structure of memory device according to the present invention will be made before proceeding to the description of the preferred embodiments of a semiconductor memory device embodying the improved gate structure according to the present invention.

The principal concept of memory devices according to an embodiment of the present invention is based on an SIT structure having a plurality of split-gate regions in the memory device for accomplishing a high packing density and a high-speed operation.

As will be described later in further detail about the respective embodiments, a vertical type structure is employed and thus the bulk mobility is used mainly for transporting charge carriers, and a plurality of split-gate regions are also used, in which one of the gate region is adapted to be applied with a control voltage, and therefore the packing density and the high-speed operation can be enhanced further.

In the memory device according to the present invention, a memory cell includes an SIT comprising a source region for supplying and retrieving charge carriers, a channel region substantially defined by a plurality of split-gate regions for transporting the charge carriers, and a storage region for storing charge carriers. An SIT comprises a drain region, a channel region, a gate region and a source region. In a memory cell, either a source or a drain region is floated and such region is called the storage region of a memory cell, and the other region which is not floating is called the source or drain region of a memory cell. This means, either one of those regions which is provided in the form of a floating region forms a storage region which may be disposed in the vicinity of the surface or embedded in the semiconductor body.

The channel region between the storage region and the source region is formed by a substantially depleted region either in a unipolar structure and in a bipolar structure, and hence it provides a potential barrier at least in part of the operative state. Furthermore, the channel region is substantially defined by split-gate regions comprising at least one driving gate region adapted for being applied with a driving voltage thereto, and at least one separated non-driving gate region not applied with a driving voltage.

The structure of the split-gate regions will reduce the capacitance of the gate region in the operative state. Thus, a high-speed operation is accomplished.

According to the present invention, a storage region is formed in a semiconductor body, and charge carriers are transported into or taken out of the storage region over the potential barrier established in the channel region. The height of the potential barrier can be reduced by a voltage applied to the storage region, the source region or the split-gate regions to cause charge carriers to travel over the potential barrier. However, there are several ways which are utilized to increase the possibility of charge carriers to travel over the potential barrier, such as: by widening the width of the portion of the low barrier height; or by decreasing the height of the potential barrier; or by decreasing the width of the region having a low drift field intensity.

Figure 22A:
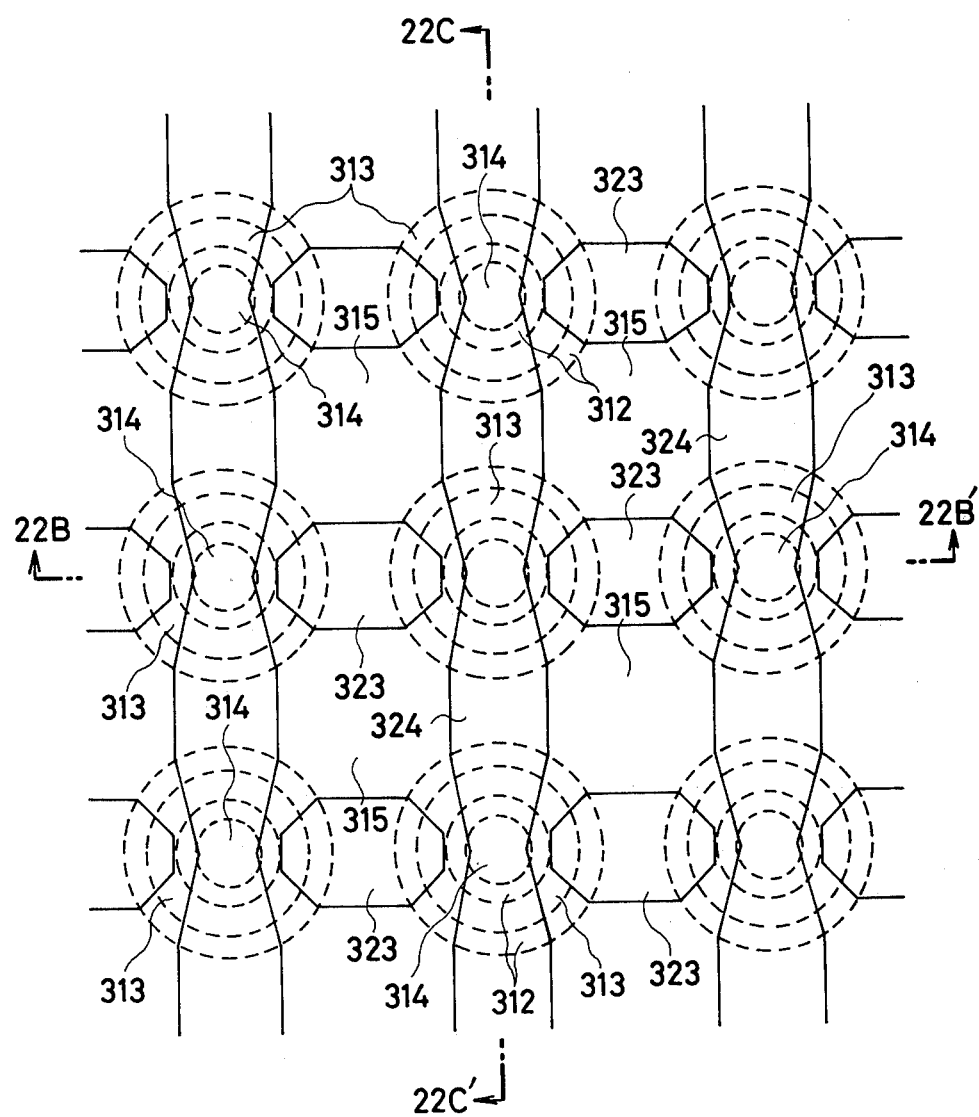
FIG. 22A shows an explanatory diagrammatic top plan view of semiconductor memory device according to an embodiment of the present invention.

FIG. 22A is a diagrammatic top view of a semiconductor memory device according to an embodiment of the present invention, while FIGS. 22B and 22C represent cross sections of the memory device along the lines 22B–22B' and 22C–22C' of FIG. 22A, respectively.

In FIG. 22A, the memory device comprises a plurarily of cylindrical memory cells interconnected by metal wiring. Each cell comprises a driving gate 314 disposed at the center, a channel region 312 surrounding the driving gate 314, a source region 313 disposed in an upper surface of the channel region 312, and a common non-driving gate region 315 surrounding the channel region 312.

The memory device is more precisely shown in FIGS. 22B and 22C. It comprises a metal electrode 330, a p type substrate 320, an n+ type storage region 311, an n− type channel region 312 wherein a potential barrier is to be established, an n+ type source region 313, a metal electrode 323 formed with a metal such as aluminum, molybdenum or a low resistivity (doped) polycrystalline silicon which is used to serve as a bit line. A word line is constituted by a metal electrode 324 made of a material same as for the bit line 323, and is connected to a p+ type driving gate region 314. A p type subsidiary non-driving gate region 315 is also used so as to electrically isolate each memory cell in the semiconductor body, thereby reducing occupation area of each cell in the surface of the semiconductor body. An insulator region 316 is made with an insulating material such as silicon oxide ($SiO_2$), silicon nitride ($Si_3N_4$), aluminum oxide ($Al_2O_3$), or a mixture of these materials.

A memory cell is formed at each cross point of the bit lines 323 and the word lines 324.

Impurity concentrations of the respective regions are about: $10^{17}$ to $10^{21}$ atoms/cm$^3$ for the storage region 311; $10^{10}$ to $10^{16}$ atoms/cm$^3$ for the channel region 312; $10^{18}$ to $10^{21}$ atoms/cm$^3$ for the source region 313; $10^{15}$ to $10^{21}$ atoms/cm$^3$ for the driving gate region 314 and for the subsidiary non-driving gate region 315; and $10^{14}$ to $10^{18}$ atoms/cm$^3$ for the substrate 320.

The channel width located between the driving gate region 314 and the subsidiary (non-driving) gate region 315, and the impurity concentration of the channel region 312 are selected so that the channel region 312 becomes almost completely pinched off by the built-in (diffusion) potential between the channel region 312 and both of the split-gate region 314 and 315. Alternatively, the impurity concentrations of the respective regions may be selected in a different way, namely, so as to ensure that the channel becomes conductive when 0 volt is applied to the driving gate region 314, and that the channel region 312 becomes sufficiently non-conductive when a reverse bias voltage, e.g., $-3$ volt is applied to the driving gate region 314. The distance between the storage region 311 and the source region 313 is desirably formed small, for example 0.5 $\mu$m$\sim$5 $\mu$m, so that the transit time of charge carriers therebetween is reduced.

When it is required to write data in a memory cell, a predetermined positive voltage is given to the bit line 323, while a forward voltage is applied to the word line 324 i.e. to the driving gate region 314 so as to reduce the height of the potential barrier established in the channel region 312. Thus, electrons are allowed to flow out from the storage region 311. Then, in proportion to the quantity of those electrons which flow out from the storage region 311, the voltage of the storage region 311 will increase in the positive polarity, due to the lack of electrons having negative charge. The flow of electrons will cease, however, when the voltage of the storage region 311 becomes equivalent to the voltage which is applied to the bit line 323. When the voltage applied for writing is removed, the storage region 311 will be held charged with a positive voltage. Also, the potential barrier will be reestablished and the charged state of the storage region 311 will be held.

Figure 20A:
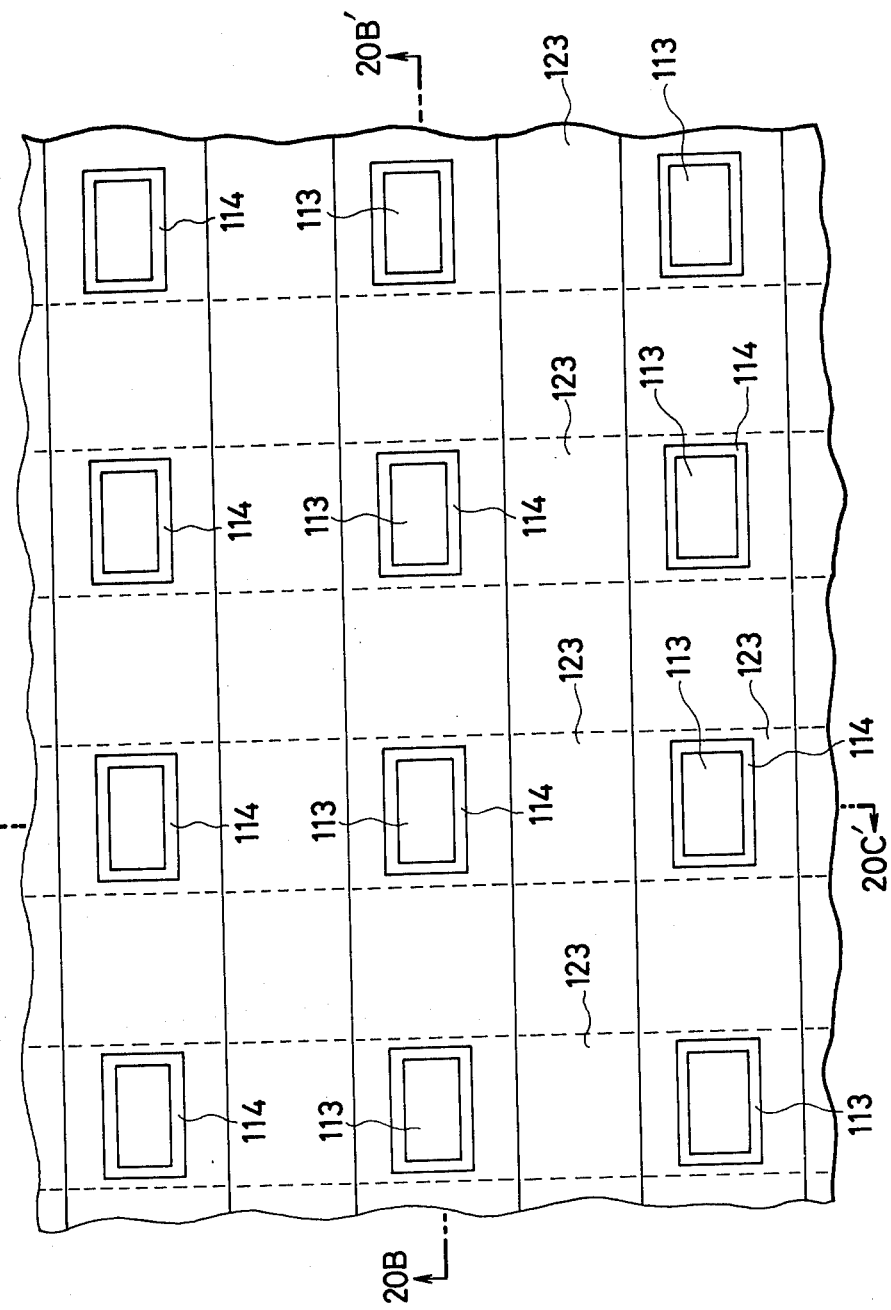
FIG. 20A shows an explanatory diagrammatic top plan view of an example of the convertional memory device.
Figure 20B:
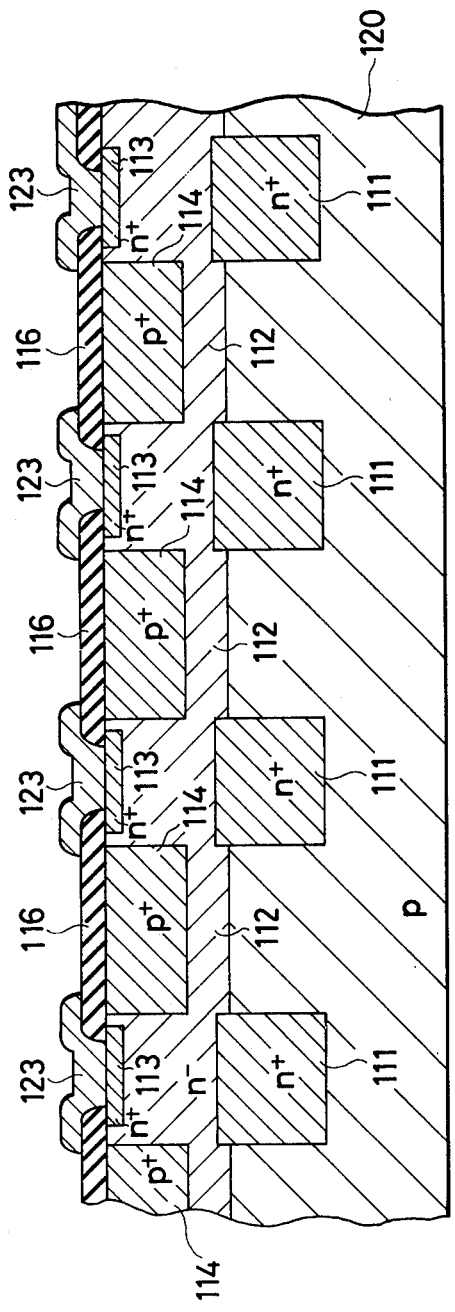
FIGS. 20B and 20C are diagrammatic sectional representations, respectively, to be conceived as being taken along the lines 20B–20B' and 20C–20C' in FIG. 20A.
Figure 20C:
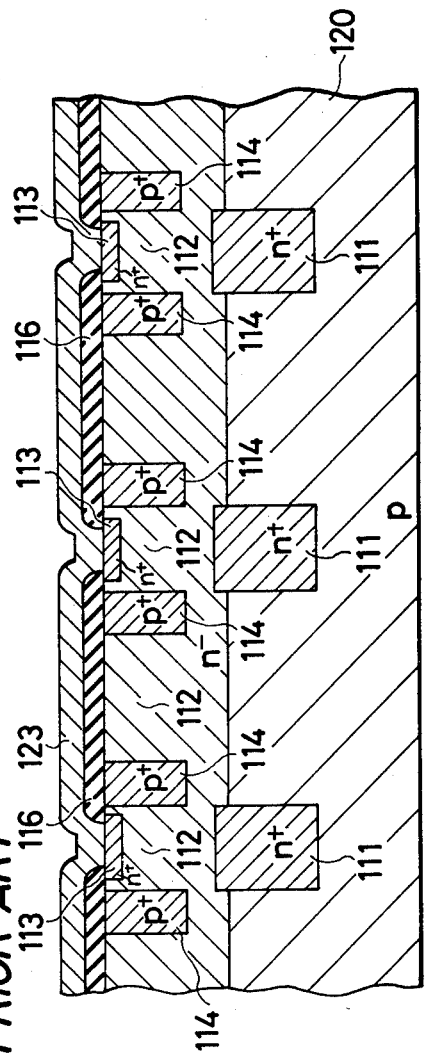
Figure 20D:
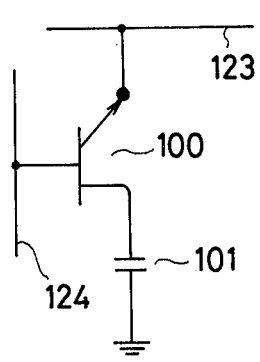
FIGS. 20D and 20E are equivalent circuit diagrams for explaining the memory device of FIGS. 20A to 20C.
Figure 20E:
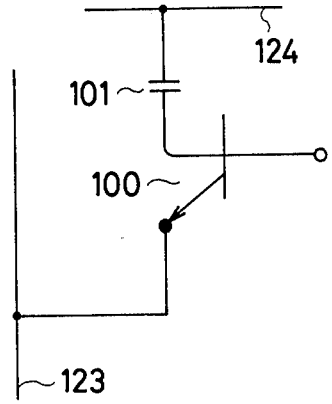
Figure 21A:
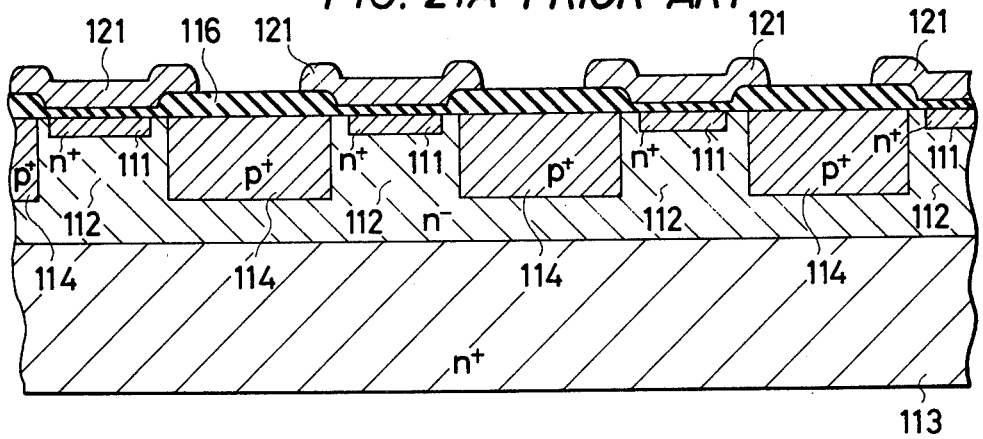
FIGS. 21A and 21B are diagrammatic sectional representations, respectively, of a conventional modification of the memory device shown in FIG. 20A.
Figure 21B:
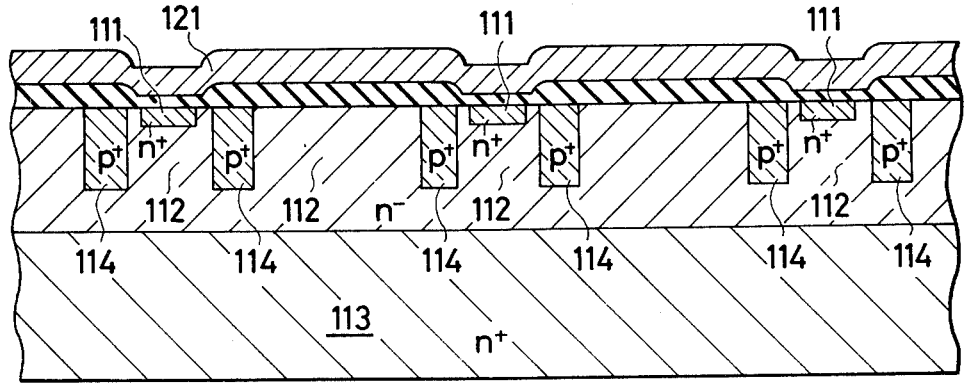

As the split-gate structure comprises the driving gate region 314 which is used to serve as a word line and the subsidiary (non-driving) gate region 315 which is not applied with a driving voltage, the capacitance of the driving gate region 314 connected to the word line 324 is extremely reduced, as compared with the conventional non-split-gate structure shown in FIGS. 20A to 20C. Therefore, charge carriers are allowed to flow at a high speed into and out of the storage region 311, and accordingly the high-speed operation of the memory device can be further enhanced.

It is another advantageous feature of this example that the space charge storage effect in the channel region 312 is greatly reduced. When a high forward voltage is applied to the driving gate region 314, minority carriers (holes in this case) are injected into the channel region 312 which then attract electrons from, for example, the storage region 311. The electrons thus attracted are caused to flow into the source region 313 connected to the bit line 323, if a positive voltage is applied to this bit line 323. In the above-mentioned example, the gate region 315 is usually held at a lower voltage than that of the driving gate region 314. Therefore, the injected minority carriers are readily absorbed by the gate region 315. Thus, the injected minority carriers are readily expelled from the channel region 312, while attracting majority carriers from the source or storage region. Thus, the space charge storage effect can be minimized.

There may be considered two methods for addressing a memory cell, depending upon the type of the structure of the channel region. In case the channel width is formed narrow and in case the impurity concentration of this channel region is selected to be sufficiently low, and in case, accordingly, a potential barrier is established sufficiently high in the channel region, then in such instance, the height of the potential barrier may not become sufficiently decreased only by applying a positive voltage to the bit line 323. Thus, a forward voltage is further applied to the word line 324 at the same time to lower the height of the potential barrier to facilitate a writing operation. In the above-mentioned structure, the writing operation is not carried out in such memory cells which are not applied with a forward voltage.

When it is desired to read or retrieve data of the storage region 311, only a forward voltage (positive voltage in this case) may be applied to the word line 324. Then the potential barrier is lowered, and electrons are allowed to flow into the positively charged storage region 311 from the source region 313.

On the other hand, if the structure (dimensions and impurity concentration) of the channel region 312 is formed so as to allow sufficient electrons to flow from the storage region 311 only by applying a positive voltage to the bit line 323, and when it is desired to inhibit the occurrence of a writing operation in those memory cells connected to the same bit line but no writing thereto is desired, it is only necessary to apply a reverse voltage to the driving gate region 314 of such concerned (non-desired) memory cells. This reverse voltage applied to the driving gate region 314 serves to hold the height of the potential barrier at a level enough for inhibiting electrons from flowing from the storage region 311.

When it is desired to read or retrieve data from the storage region 311, it is only necessary to remove the reverse voltage applied to the driving gate region 314, and also to apply a low voltage of, for example 0 volt, to the driving gate region 314 instead of said reverse voltage. Whereupon, electrons flow from the source region 313 into the positively charged storage region 311. The presence of data in the memory cell is detected by the flow of current between the source region 313 and the storage region 311. In this manner, the voltage of the storage region 311 can be detected.

The current is allowed to flow due to the fact that the channel region 312 is opened and that the channel region between the storage region 311 and the source region 313 becomes conductive by controlling the voltage applied to the word line 324, or the bit line 323.

In some other cases, it may be useful to form an impurity concentration distribution between the storage region 311 and the substrate 320 so that the storage region 311 will exhibit a desirable voltage change in accordance with the quantity of charges delivered from the storage region 311.

Specifically considering the capacitance of the storage region 311, let us now assume that a capacitance of 0.18 pF is desired under the following conditions that the memory storage region 311 is 23 $\mu m\phi$ and that the voltage applied to the bit line (for writing) 323 is 10 volts. In such an instance, it is only necessary to select the impurity concentration of the substrate to be $1\times10^{17}$ atoms/cm$^3$. Then, the capacitance of 0.18 pF is realized.

Especially in the memory device shown in FIGS. 22A to 22D, the capacitance of the bit line 323 can be decreased, e.g. to about 1/10 of the conventional memory device, by: arranging respective memory cells to be disposed as close as possible to each other; increasing the thickness of the insulator region 316; decreasing the thickness of the source region 313 to for example less than 0.3 $\mu$m; and disposing the source region 313 apart from its adjacent gate regions 314 and 315. Thus, the magnitude of the capacitance of the storge region 311 can be reduced to 0.018 pF and further, along therewith, each memory cell can be formed to be 7 $\mu m\phi$. It will be apparent that the subsidiary (non-driving) gate region 315 works also as an isolation region between adjacent memory cells, and thereby increases the packing density of the memory device.

Figure 22D:
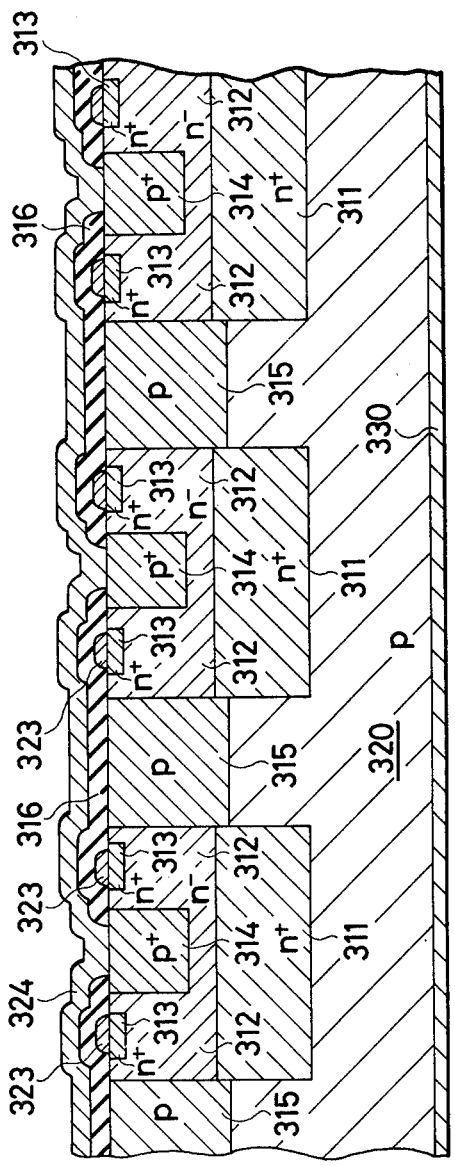
FIG. 22D is a diagrammatic sectional view of a modification of the memory device shown in FIG. 22A.

FIG. 22D is a diagrammatic section of another example of the memory device shown in FIG. 22A. The memory device is different from the example of FIGS. 22B and 22C only in that it has an annular electrode 323 formed on each power source region 313, but otherwise it has a structure and operational behavior analogous to that shown in FIGS. 22A to 22C. Therefore, further explanation of the structure as well as operational behavior of the memory device shown in FIG. 22D will be dispensed with.

In the above-stated memory device having a plurality of split-gate regions, the region which is utilizable as the channel region and which is relatively large can be controlled effectively by a small gate region (a driving gate region 314). Thus, the transconductance gm (and the current gain) can become great, whereas the capacitance of the word line can become small. Therefore, the high-speed operation of the memory device is enhanced further. Even if the size of the drain region 313 is reduced, it will not affect the flow of electric current, because the current is converged toward the drain region 313.

Figure 23A:
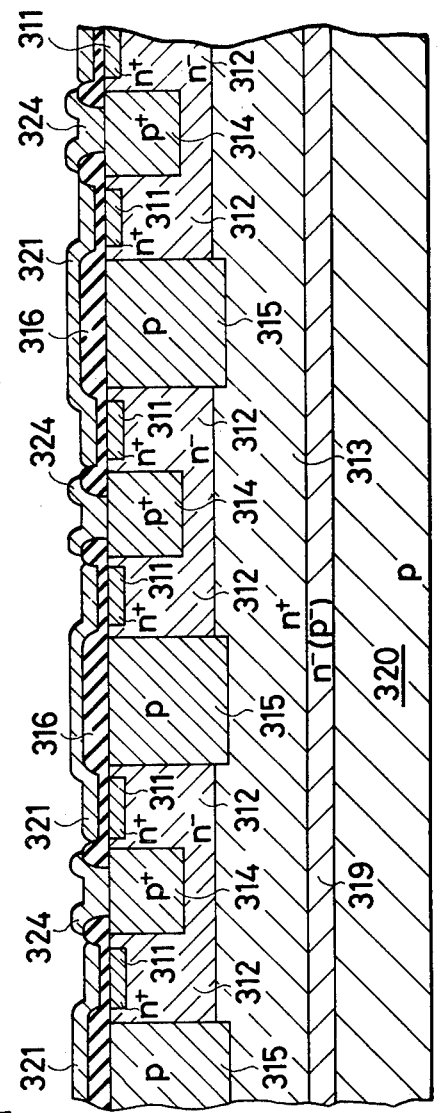

FIGS. 23A and 23B are diagrammatic sections of alternative example of the memory device as shown in FIGS. 22A to 22C. The memory cell comprises a p type substrate 320, and an $n^-(p^-)$ type region 319 adapted for reducing the parasitic capacitance between the substrate 320 and a source region 313 which is embedded in the semiconductor body and used as a bit line. The memory cell further comprises: an $n^-$ type channel region 312; a p type subsidiary (non-driving) gate region 315 which also separates adjacent memory cells; a $p^+$ type gate region 314 adapted for being applied with a driving voltage; and a word line 324 formed with a metal such as aluminum and molybdenum, or a low resistivity (doped) polycrystalline silicon, or a mixture thereof. Further, the memory device comprises: an $n^+$ type storage region 311; an electrode 321 made with the same material as the electrode 324; an insulator region 316 formed with such a material as silicon oxide ($SiO_2$), silicon nitride ($Si_3N_4$) or aluminum oxide ($Al_2O_3$), or a combination thereof; and a insulator region 317 formed with the same material as that of the insulator region 316, or an insulator resin such as polyimide.

In this instance, the storage region 311, the insulator region 316 and the electrode 321 jointly form a MIS type storage capacitance.

When a writing operation is to be performed, a forward voltage is given to the word line 324, to render the channel region 312 conductive, while a positive voltage is applied to the bit line 313. Whereupon, as stated previously, electrons flow from the storage region 311 into the bit line 313, and thus the storage region 311 becomes positively charged. If the forward voltage given to the word line 324 is removed, then the storage region 311 is held in the charged state.

When a reading operation is to be carried out, a forward voltage is applied to the word line 324 to render the channel region 312 conductive. Whereupon, electrons are allowed to flow into the storage region 311. Therefore, the state of the storage region 311 can be detected by the presence or the absence of the current.

The impurity concentration of the respective semiconductor regions are selected in a manner almost the same as that for the memory device shown in FIGS. 22A to 22C.

For minimizing the capacitance of the bit line 313, the high-resistivity region 319 formed with a $p^-$ type ($n^-$ type or intrinsic semiconductor) region is inserted between the bit line 313 and the substrate 320, or in addition thereto, the distance between the subsidiary gate region 315 and the bit line 313 may be increased.

The insulator region 316 has a reduced thickness especially at such site located between the storage region 311 ad the electrode 321, for increasing the storage capacitance therebetween. This reduced thickness may be in the range of about 100 Angstroms to about 1,500 Angstroms. The other portion of the insulator region 316 is formed thicker, for example 3,000 Angstrom to 2 $\mu$m, for decreasing the capacitance of the word line 324.

The embodiments shown in FIGS. 22A to 23B are not limitative, but only for assisting the advantageous features of the present invention to be understood clearly. For example, in the structure of the embodiments, in case the conductivity type of the respective regions is completely reversed, and in case it is intended to obtain the same operational features of the memory device, it is only necessary to change the polarity of the applying voltages thereto.

In the above-mentioned examples of memory devices, only the junction type gate structure is shown. However, Schottky type, MIS type including MOS type structures may be equally effectively employed.

The split-gate structure comprises at least one driving gate region and at least one separated subsidiary (non-driving) gate region.

The subsidiary gate region may be biased at an appropriate voltage. Further, when the subsidiary gate is formed of a plurality of split regions, different potentials may be given thereto, respectively. In case the driving gate is formed of a plurality of split regions, different driving signals may be applied thereto, respectively. In such an instance, the charge carriers which flow through the channel region 312 will become more precisely controllable. The impurity concentrations of such respective split gate regions can also be selected to be different from each other, depending upon the purpose of operation.

FIGS. 24A and 24B are another example of a memory device embodying the present invention, wherein FIG. 24A is a top plan view, and FIG. 24B is a sectional view taken along the line 24B–24B' in FIG. 24A. A memory cell is formed in a square shape in FIG. 24A, wherein only a driving gate region 314, a storage region 311, a subsidiary gate region 315, and a channel region 312 (FIG. 24B) are depicted. More precisely, the memory cell shown in FIG. 24B, comprises: an n+ type source region 313 used as a bit line; an n− type channel region 312; an n+ type storage region 311; a p+ type driving gate region 314 having an electrode 324 used as a word line; a p+ type subsidiary gate region 315; an insulator region 316; and an electrode 321 provided on the insulator region 316. A MIS type storage capacitance is formed by the electrode 321, the insulator region 316, and the storage region 311.

In this structure, since the wide channel region 312 can be effectively controlled by the small driving gate region 314, a very-high-speed operation can be achieved.

The operational description of the device is omitted here, since the operational characteristics are almost the same as those of the memory device shown in FIGS. 22A to 22C.

In this structure shown in FIGS. 24A and 24B, the memory cell is formed as a discrete element. In an memory array, however, the gate region 315 may be formed common to respective memory cells.

The storage region 311 may be embedded in the semiconductor body away from the surface of the semiconductor body. Further, the subsidiary gate region 315 may be given a certain potential, depending upon the purpose of operation, or may be floated.

The shape of the channel region 312 substantially defined by the split gate regions 314 and 315, may not be limited to rectangular, square, ellipse or stripe shape.

Figure 25A:
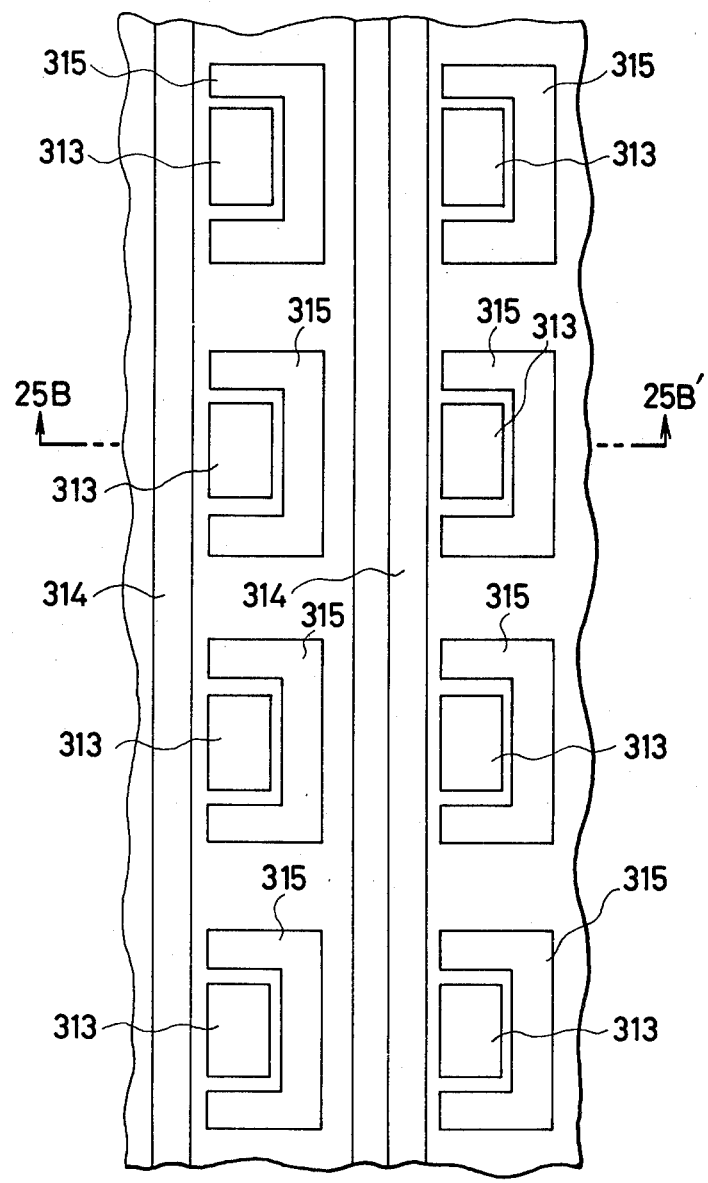
FIG. 25A is an explanatory top plan view of still another example of a semiconductor memory device according to another embodiment of the present invention.

FIG. 25A is a diagrammatic representation of a top plan view of a still another example of a memory device according to an embodiment of the present invention, wherein only a drain region 313, a driving gate region 314, a subsidiary gate region 315, and a channel region 312 (FIG. 25B) are shown.

Figure 25B:
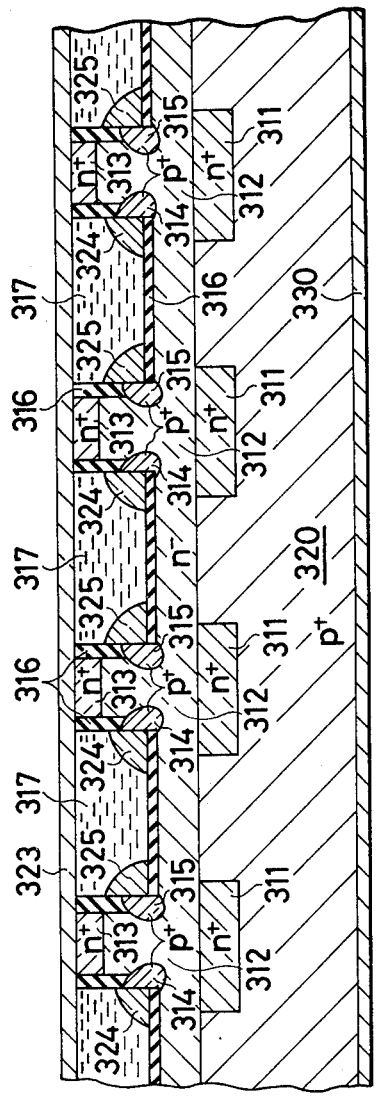
FIGS. 25B, 25C and 26 show different examples of a cross section of the semiconductor memory device along the line 25B–25B' of FIG. 25A.
Figure 25C:
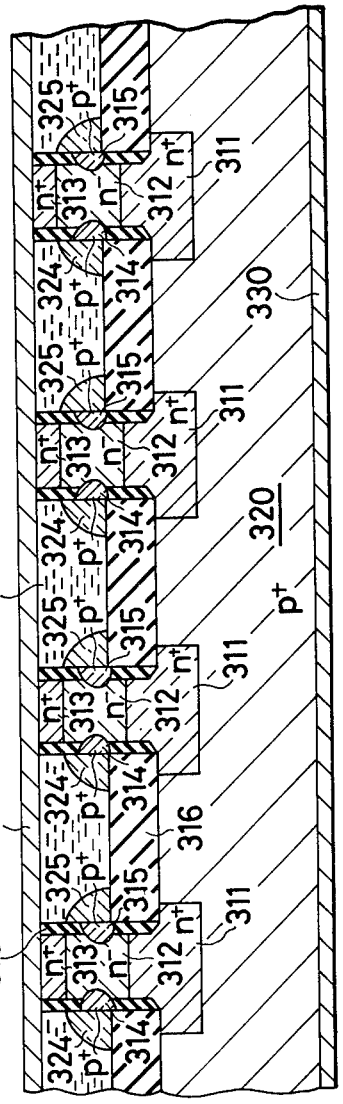

FIGS. 25B and 25C are sectional views of the modifications of the memory device having the same top plan view as that shown in FIG. 25A.

The memory device in FIG. 25B comprises: a metal electrode 330; a p+ type substrate 320; an n+ type storage region 311; an n− type channel region 312; an n+ type source region 313; a metal electrode 323 used as a bit line; a p+ type driving gate region 314 having an electrode 324 used as a word line; a p+ type subsidiary gate region 315 having an electrode 325 which may be eliminated unless a certain voltage is required for the subsidiary gate region 315; and insulator regions 316 and 317.

The difference between the memory devices shown in FIGS. 25B and 25C lies only in the depth of the embedded region, i.e. the insulator regions 316 and 317, adapted for preventing punch-through current to occur between the substrate 320 and the driving gate region 314. In FIG. 25B, the embedded region does not reach the storage region 311, while in FIG. 25C, the embedded region reaches completely the storage region 311.

Figure 26:
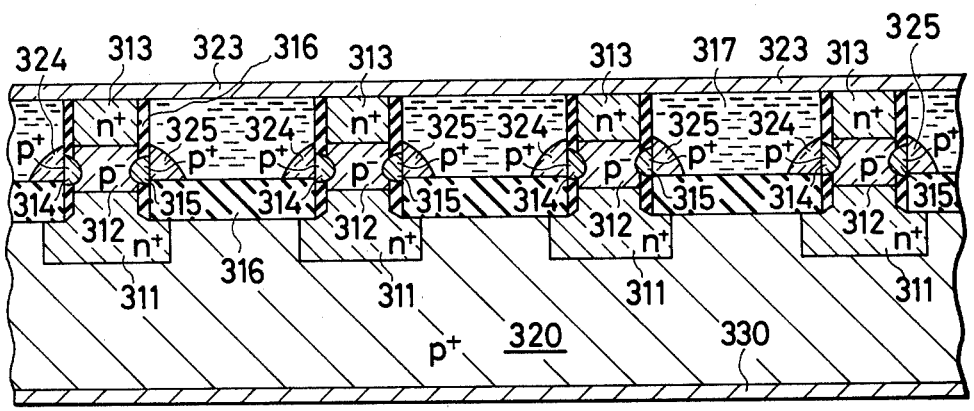

On the other hand, in FIG. 26 a bipolar transistor having a base region which is almost punched through is shown. The memory device comprises an n+ type collector region 313, a p type base region 312 and an n+ type emitter region 311. In this structure, the bipolar transistor exhibits an operational behaviour analogous to an SIT. This has been already disclosed in Japanese patent application Nos. 52-15879 under the title of "Semiconductor device and semiconductor integrated circuit", and 52-17327 entitled "Semiconductor integrated circuit", and in U.S. patent application No. 878,441 (1978) under the title "High-speed and high-density semiconductor memory".

In this structure illustrated it should be understood that, when the impurity concentration of the p− type region 312 is sufficiently low and when its width is sufficiently small, the channel region 312 will allow electrons to flow only by giving a positive voltage to the bit line 323. However, when the impurity concentration of the channel region 312 is high or its width is large, there has to be applied a forward voltage to the driving gate region 314 to decrease the height of the potential barrier produced in the channel region so as to allow electrons to flow.

The impurity concentrations of the respective regions of the memory devices shown in FIGS. 25A to 26 are selected almost the same as those of FIGS. 22A to 22C. Furthermore, in this structure, punch-through current can almost be prevented to occur between the adjacent memory cells or between the driving gate region 314 and the substrate 320. Further, the charge stored in the storage region 311 can not be allowed to leak out therefrom. Thus, a desired voltage can be applied to the respective regions without a fear of leak current. Especially, in the structure of FIGS. 25A to 26, the magnitude of the voltages applied to or stored in the respective regions, especially the magnitude of the voltage applied to the storage region 311, can be increased up to just before a break-down takes place between the semiconductor regions. Since the applicable voltage has, thus, a wide range of allowance, the operational range of the memory device is widened accordingly. This is especially effective in case this memory device is used as an analog memory device.

In the structure shown in FIGS. 25A to 26, the sourcegate capacitance as well as the gate-drain capacitance is minimized, thereby further enhancing the high-speed operation. The channel region 312 is defined by the split gate regions 314 and 315. The shape of the channel region 312, however, may be cylindrical, elliptic, rectangular and so on.

Since the operational behavior of the device in FIGS. 25A to 26 is almost same as that of FIGS. 22A to 22C, a precise description will be omitted.

In this specification, the storage state of the memory device is described mainly along the concept of a digital memory device, wherein the stored state takes only two different states, namely "1" or "0", i.e. presence or absence of charge in the storage region 311. However, according to the present invention, the quantity of the charge stored in the storage region 311 is almost proportional to the magnitude of the voltage applied to the bit line 323. Therefore, this memory device can be used as an analog memory device. Accordingly, when this storage is read out by an application of a constant voltage to the bit line 323, a current having a magnitude proportional to the quantity of charge stored during the writing operation can be obtained. This means, according to the present invention, that an analog memory device as well as a digital memory device can be provided.

In case of an image-memory device, brightness of each spot of the image is to be memorized. For example, it may be stored in sixteen different conditions each representing the magnitude of the brightness of a spot. In this case, when it is desired to store the brightness in a digital memory, a signal for each spot is first converted to a digital signal, namely to a four-bit signal (which is capable of representing $2^4=16$ different conditions) by an analog-digital converter, and then it is stored in a digital memory. Therefore, four memory cells (constituting four bits) are required for memorizing the condition of brightness of each spot.

Moreover, if it is desired to represent brightness of each spot with higher precision, for example thirty-two different conditions of brightness are to be stored in the digital memory, there have to be used five memory cells (which are able to represent $2^5=32$ different conditions) to represent each spot. In addition, the analog-digital converter for converting analog signals to digital signals will naturally become more complicated. When the analog memory device of the present invention is employed in this case, only one memory cell is required to represent the thirty-two conditions of each spot. Even when the brightness of each spot changes with the lapse of time, no analog-digital converter is needed, but only a sampling-and-holding circuit is required.

As described above, the memory device of the present invention is extremely suitable to store an analog quantity (an analog value) representing a quantity of an image, sound or the like. High-speed operation is enhanced, since charge carriers are transported by the bulk-mobility and are drifted by the electric field in the channel region 312. Furthermore, it is easy to form each memory cell in a small size as 10 μm×10 μm square, thus enabling a packing density of about 1,000,000 bits/cm² to be realized easily, whereby an analog memory device as well as a digital memory device having high-speed operation and high packing density can be realized.

Figure 27A:
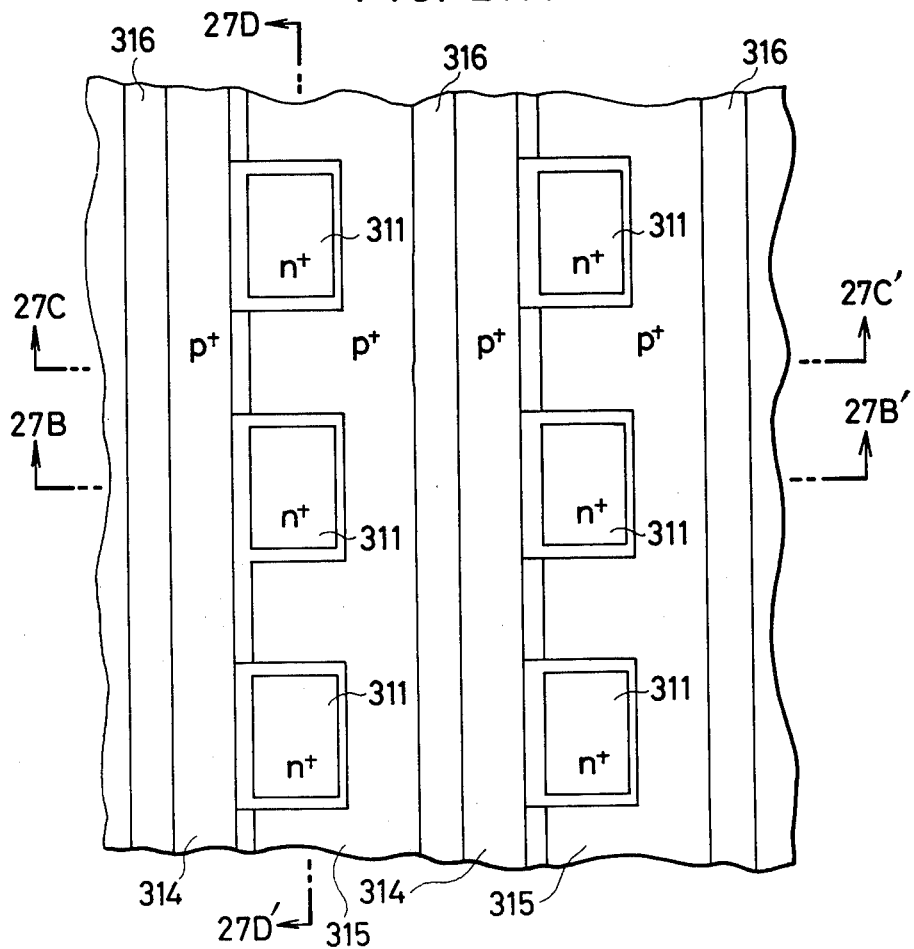
FIG. 27A is an explanatory top plan view of further example of a semiconductor memory device according to another embodiment of the present invention.
Figure 27B:
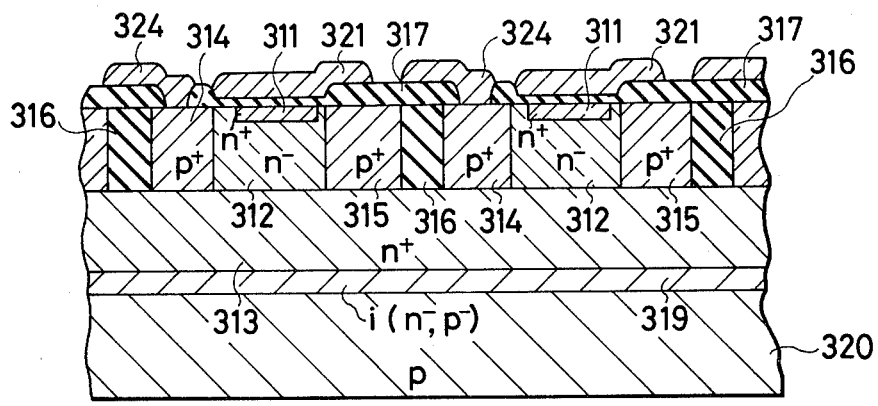
FIGS. 27B to 27D are diagrammatic sections, respectively, to be conceived as being taken along the lines 27B–27B', 27C–27C' and 27D–27D' of FIG. 27A.

FIGS. 27A to 27D show a further example of memory device according to another embodiment of the present invention. FIG. 27A is a diagrammatical representation of a top plan view of the memory device comprising a p+ type driving gate region 314, a p+ type subsidiary gate region 315, an n+ type storage region 311, an insulator region 316, and an n− type channel region 312 (FIG. 27B).

Figure 27C:
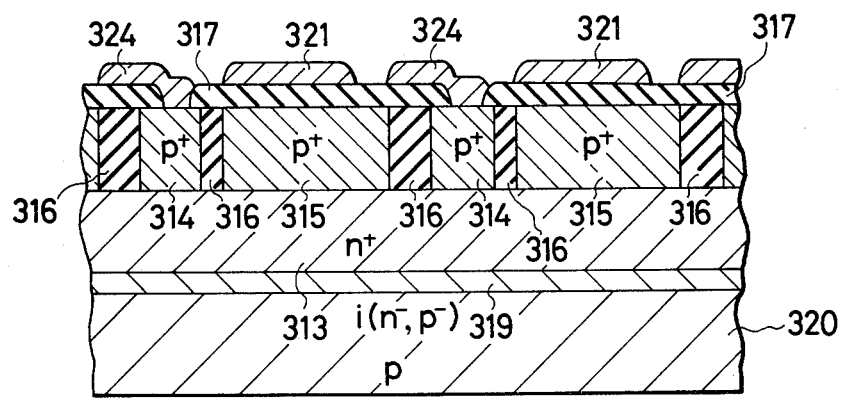
Figure 27D:
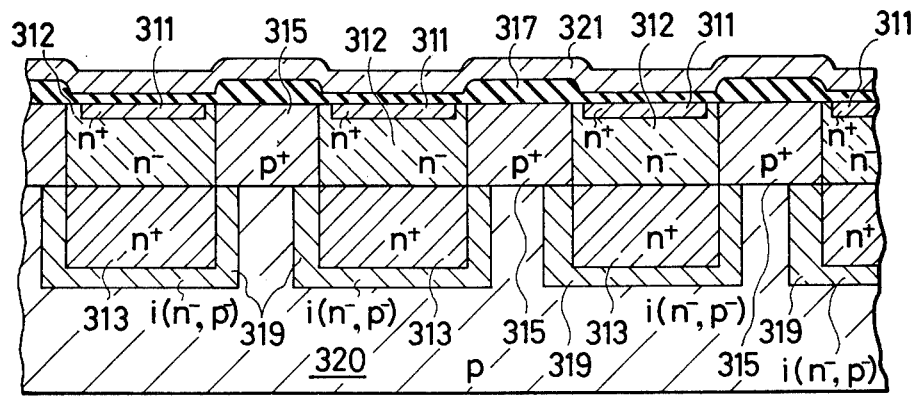

FIGS. 27B, 27C and 27D are diagrammatical sections of the memory device shown in FIG. 27A, taken along the lines 27B-27B', 27C-27C' and 27D-27D', respectively. In FIG. 27B, the memory device comprises a p type substrate 320, an n− type (p− type or an intrinsic semiconductor) region 319 which is formed between the substrate 320 and an n+ type source region 313 used as a bit line. Split gate structure comprises a driving gate region 314 adapted to apply a voltage for controlling channel region 312 formed with an n− type region, and a subsidiary gate region 315 which may be floated or may be held at a desired potential depending on the purpose of operation. By employing this structure shown, the capacitance of the gate region is extremely reduced and the high-speed operation of the memory device is enhanced. The memory device further comprises: an n+ type storage region 311; an insulator region 317 formed with silicon oxide ($SiO_2$), silicon nitride ($Si_3N_4$) or aluminum oxide ($Al_2O_3$), or a combination thereof; and an electrode 321 made of metal such as aluminum, molybdenum or a low resistivity (doped) polycrystalline silicon or the like. In such structure shown, a MIS type storage capacitance is formed by these elements. A metal electrode 324 is connected to the driving gate region 314 to be used as a word line. The respective memory cells are separated from each other by the insulator region 316 as seen in FIG. 27B and also by the gate region 315 as seen in FIG. 27D.

Since the operational behavior of this instant device is analogous to that of the memory device shown in FIGS. 22A to 22C, the description of the operational behavior of this device is dispensed with. A relatively high resistivity region 319 formed with an intrinsic semiconductor region or an n− type or p− type region is employed to reduce the capacitance between the source region 313 and the substrate 320 to enhance the high-speed operation.

Figure 28C:
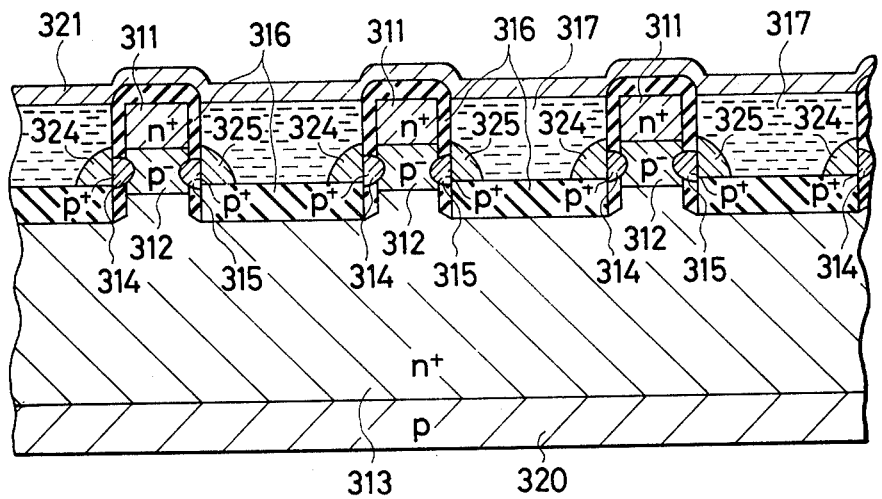

FIGS. 28A to 28C are diagrammatic sections of another memory device having the top plan view shown in FIG. 27A. In these memory devices, an insulator region 317 filling a recessed portion is formed between each memory cell. This structure further prevents punch-through current to flow between the split-gate regions and the P type substrate 320. In the memory devices of FIGS. 28A and 28B, only the depth of the insulator regions 317 and 316 is different from one another. In each of these examples, the memory cell comprises: a p type substrate 320; an n+ type source region 313 used as a bit line; an n− type channel region 312; an n+ type storage region 311; a metal electrode 321 provided over an insulator region 316; a p+ type driving gate region 314 forming Schottky contact with an electrode 324 used as a word line; and a p+ type subsidiary gate region 315 having an electrode 325 which may be floated or may be given a voltage depending upon the purpose of operation. The storage capacitance is established between the electrode 312 provided over the insulator region 316 and the storage region 311.

The memory device shown in FIG. 28C is analogous to FIGS. 28A and 28B, except that this memory cell is formed with a bipolar transistor comprising an n+ type collector region 311 used as a storage region, a p− type base region 312 and an n+ type emitter region 313 used as a source region (a bit line), wherein the base region 312 is almost punched through. As mentioned previously in conjunction with FIG. 26, a bipolar transistor having such a punch-through base region exhibits an operational behavior analogous to an SIT.

The inpurity concentrations as well as the operational features of these memory devices are almost the same as those of the memory devices described hereinafter. Thus, further explanation is omitted.

Figure 29:
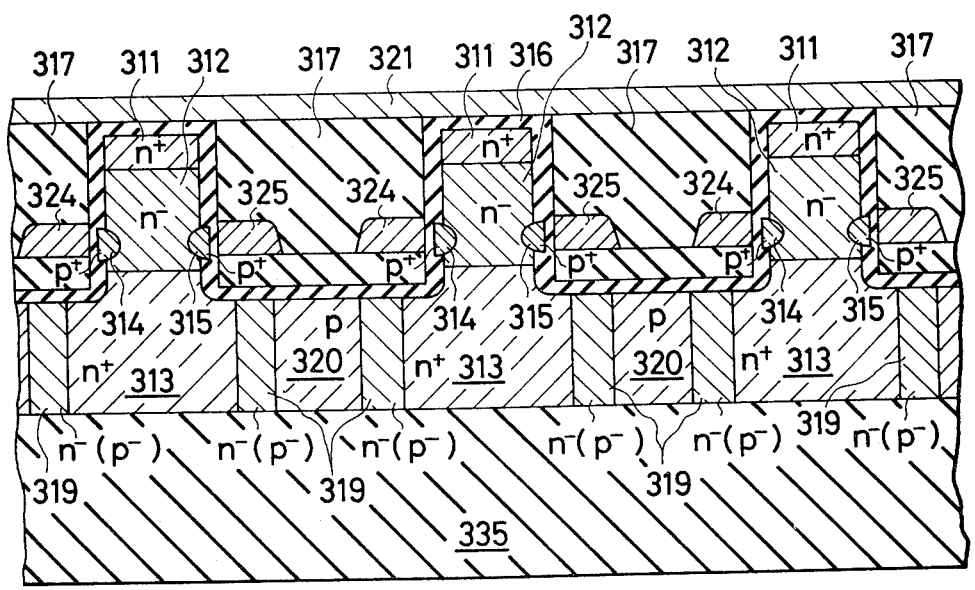
FIG. 29 is a diagrammatic section of another example of a semiconductor device according to the present invention.

FIG. 29 is a diagrammatic section of still another example of a dynamic memory structure according to the present invention. In this structure, the memory cell comprises an insulator substrate 335 formed of sapphire, spinel or the like, a p type (an n type or an intrinsic semiconductor) region, a p type region 320 which isolates each memory cell, an n+ type source region 313 used as a bit line, an n− type channel region, an n+ type storage region 311, an insulator region 317 filling an recessed portion and adapted for isolating each memory cell, an insulator region 316, and p+ type split-gate regions 314 and 315. The split-gate structure comprises a driving gate region 314 connected to an electrode 324 provided over the insulator region 316, and a subsidiary gate region 315 connected to an electrode 325 provided over the insulator region 316, wherein the electrode 325 may be dispensed with unless a certain voltage is required. The storage capacitance is formed with the storage region 311, the insulator region 316 and an electrode 321.

The split-gate structure is formed in an MIS type, and further the insulator substrate 335 is used for reducing the capacitance between the source region 313 and the substrate 335, thereby enhancing high-speed operation of the memory device.

Since the operational behavior is almost same as that of FIGS. 22A to 22C, further explanation is omitted.

As has been described hereinabove, according to the present invention, a semiconductor element comprises: a source region; a drain or storage region; a split-gate structure; and a channel region adapted for producing, in the channel region, a potential barrier which, in turn, is controllable by the voltage of the source region relative to the drain or the storage region and also by the voltage applied to the split-gate structure. The split-gate structure comprises at least one driving gate region adapted to apply a voltage for controlling the potential barrier, and at least one subsidiary (non-driving) gate region which may be floated or may be given a certain voltage depending upon the purpose of operation.

It should be understood that the present invention is equally effectively applicable to a gate structure of pn junction type, Schottky type, or a metal insulator semiconductor (MIS) type including MOS type.

Furthermore, in the semiconductor device according to the present invention, the semiconductor material may be any one of silicon, germanium, III–V compounds, II–VI compounds and other semiconductors. Wide gap semiconductors such as gallium arsenide are adapted for providing high potential barriers. Also, the insulating material is not limited to those described above.

Furthermore, the shape of the channel region is not limited to those depicted in the drawings. For example, concentric circle, square, rectangular, elliptic, striped shape or any other shapes may be employed. The split-gate structure in the drawings is not limitative. Each split-gate region may be given independent potential for controlling the channel region.

Also, the impurity concentrations of the respective semiconductor regions are not limited to those of the embodiments but as is obvious to those skilled in the art, they may be determined depending on the structure as well as on the purpose of operation.

A memory array comprising a plurality of word lines and a plurality of bit lines can be easily made by disposing such a memory cell as mentioned above at each cross point of the word lines and the bit lines.

The semiconductor device according to this invention can be easily manufactured by relying on the conventional techniques such as selective growth, selective diffusion, ion implantation, selective etching, plasma etching, thermal oxidation, chemical vapor deposition, electron or ion beam sputtering or like techniques.

As will be clear now from the description made hereinabove, the semiconductor device according to the present invention provides high speed operation by making use of the bulk mobility for transporting charge carriers which are drifted by an electric field. In the semiconductor device, each element, can be formed vertically and isolated by a non-driving gate region. Therefore, high packing density can be provided. A plurarity of split-gate regions are provided for reducing the operational capacitance of the gate structure, thereby enhancing the high-speed operation of the semiconductor device.

Furthermore, in case the semiconductor device of the present invention is not needed to be operated at a very-high-speed, those metal electrodes and wirings may be replaced by semiconductor regions.

Since the driving voltage is applied only to the driving gate and not to the non-driving gate, the effective capacitance of the gate is reduced to enable enhancement of high-speed operation.

When the split-gate structure is formed with pn junctions and when the driving gate region is forwardly biased, minority charge carriers may be injected from the driving gate region into the channel region. These minority charge carriers can help injection of majority carriers and be effectively absorbed by the non-driving gate region which may be held at the source potential. The impurity concentration of the split-gate regions may be positively selected to be different relative to each other. Namely, the efficiency of carrier absorption of the non-driving gate is influenced by the impurity concentration of the non-driving gate region. A more heavily doped non-driving gate region has a lower potential for the minority carriers (carriers of a conductivity type same as that of the gate region) in the channel region. Thus, a higher impurity concentration of the non-driving gate region is desirable to provide a more effective absorption of minority carriers. This, however, leads to a weaker attracting force for the majority carriers of the source (or drain) region. Thus, the current gain may be lowered, if a higher impurity concentration is selected for the non-driving gate. The impurity concentration of the non-driving gate region may be selected at a lower level than that of the driving gate region when it is desired to limit the minority carrier absorption from the channel region into the non-driving gate region. The relation of the impurity concentration in the respective split gate-regions may be estimated by the following formula.

$$E_F - E_i = kT \ln (N_{NO}/N_i)$$

wherein: Ni represents the number of thermally excited free carriers in an intrinsic semiconductor; $N_{NO}$ the number of free carriers excited from the impurity atoms; k the Boltzmann constant; T the absolute temperature; $E_F$ the Fermi level; and $E_i$ the mid-gap energy (Fermi level of the intrinsic semiconductor). For example, a region having a carrier concentration of $10^{20}$ cm$^{-3}$ has a potential 0.15 eV (0.008 eV) which is a value lower than that of a region having a carrier concentration of $10^{17}$ cm$^{-3}$ ($10^{18}$ cm$^{-3}$) in case of silicon. For limiting the excessive gate current and for raising the current gain, a resistance may be connected between the non-driving gate region and the source region. The resistance may also be given by the non-driving gate region by itself.

In both the specification and the appended claims of the present application, a channel should be understood to mean such portion of path of current within a channel region as defined by the structure of the split-gates and that the current passing therethrough is controlled substantially by the gate voltage.

What is claimed is:

1. A semiconductor device formed in a semiconductor body having first and second parallel principle surfaces and including at least one vertical current channel at which a main current is substantially controlled and at which charge carriers constituting said main current are allowed to flow substantially perpendicular to said principal surfaces, comprising:

at least one channel semiconductor region disposed in said semiconductor body to form said at least one current channel therein;

a source semiconductor region for supplying said charge carriers from said channel semiconductor region, disposed at the other end of said channel semiconductor region; and at least one drain means for retrieving said charge carriers from said channel semiconductor region, disposed at the other end of said channel semiconductor region; and means for controlling the potential profile in said channel semiconductor region to define said current channel, including a first gate means and a second gate means disposed adjacent to a same portion of said channel semiconductor region and separated from each other, said current channel being defined at said portion, in said channel semiconductor region partially by said first gate means and partially by said second gate means, said first gate means being adapted to be connected to a signal source for developing, in said channel semiconductor region, a depletion region with a width depending on a controlling signal supplied from said signal source, said second gate means being adapted to be connected to a dc bias source for developing, in said channel semiconductor region, a depletion region with a width depending on a dc bias supplied from said dc bias source.

2. A semiconductor device formed in a semiconductor body having first and second parallel principal surfaces and including at least one vertical current channel at which a main current is substantially controlled and at which charge carriers constituting said main current are allowed to flow substantially perpendicular to said principal surfaces, comprising:

at least one channel semiconductor region disposed in said semiconductor body to form said at least one current channel therein;

a source semiconductor region for supplying said charge carriers into said channel semiconductor region, disposed at one end of said channel semiconductor region;

at least one drain means for retrieving said charge carriers from said channel semiconductor region, disposed at the other end of said channel semiconductor region; and means for controlling the potential profile in said channel semiconductor region to define said current channel, including a first gate means and a second gate means disposed adjacent to a same portion of said channel semiconductor region and separated from each other, said current channel being defined at said portion in said channel semiconductor region partially by said first gate means and partially by said second gate means, said first gate means being adapted to be connected to a signal source for developing, in said channel semiconductor region, a depletion region with a width depending on a controlling signal supplied from said signal source, and said second gate means being electrically connected to said source semiconductor region.

3. A semiconductor device formed in a semiconductor body having first and second parallel principal surfaces and including at least one vertical current channel at which a main current is substantially controlled and at which charge carriers constituting said main current are allowed to flow substantially perpendicular to said principal surfaces, comprising:

at least one channel semiconductor region disposed in said semiconductor body to form said at least one current channel therein;

a source semiconductor region for supplying said charge carriers into said channel semiconductor region, disposed at one end of said channel semiconductor region;

at least one drain means for retrieving said charge carriers from said channel semiconductor region, disposed at the other end of said channel semiconductor region; and means for controlling the potential profile in said channel semiconductor region to define said current channel, including a first gate means and a second gate means disposed adjacent to a same portion of said channel semiconductor region and separated from each other, said current channel being defined at said portion in said channel semiconductor region partially by said first gate means and partially by said second gate means, said first gate means being adapted to be connected to a signal source for developing, in said channel semiconductor region, a depletion region with a width depending on a controlling signal supplied from said signal source, and said second gate means being electrically isolated from each of said source semiconductor region, said means for retrieving said charge carriers and said first gate means.

4. A semiconductor device according to claims 1, 2 or 3, in which: said first gate means is smaller in dimension than said second gate means.

5. A semiconductor device according to claims 1, 2, or 3, in which: said second gate means surrounds said first gate means.

6. A semiconductor device according to claims 1, 2, or 3 in which: said channel semiconductor region has a substantially cylindrical shape.

7. A semiconductor device according to claim 1, 2, or 3 further comprising a recess extending from said first surface and at which is provided at least one of said first and second gate means.

8. A semiconductor device according to claim 7, further comprising an insulator region filling said recess.

9. A semiconductor device according to claims 1, 2, or 3, in which: the number of said at least one drain means is at least two, and said channel is provided for each of the drain means, and said second gate means is formed in a single structure.

10. A semiconductor device according to claim 9, in which: said first gate means has a plurality of projections extending toward said second gate means and defining said channels therebetween.

11. A semiconductor device according to claim 9, in which: said second gate means has a plurality of projections extending toward said first gate means and defining said channels therebetween.

12. A semiconductor device according to claims 1, 2 or 3, in which: at least one of said first and second gate means comprises a conductor forming a Schottky contact with said channel region.

13. A semiconductor device according to claim 1, 2 or 3, in which: at least one of said first and second gates comprises a MIS structure formed with an electrode, an insulator and said channel region.

14. A semiconductor device according to claims 1, 2 or 3, in which: said first and second gate means comprise semiconductor regions forming pn junctions with said channel region.

15. A semiconductor device according to claim 14, in which: said second gate is electrically connected to said source.

16. A semiconductor device according to claim 2, further comprising a resistance connected between said second gate means and said source.

17. A semiconductor device according to claim 14, in which: said first gate means has a lower impurity concentration than said second gate means.

18. A semiconductor device according to claim 14, in which: said first gate means has a higher impurity concentration than said second gate means.

19. A semiconductor device according to claim 14, further comprising an insertion region inserted between said first and second gate means for preventing the occurence of punchthrough therebetween.

20. A semiconductor device according to claim 19, in which: said insertion region comprises an insulator region.

21. A semiconductor device according to claim 19, in which: said insertion region comprises a semiconductor region having a conductivity type opposite to that of said channel region.

22. A semiconductor device according to claim 14, in which: said first and second gate means contact at least one of said drain means and source.

23. A semiconductor device according to claim 14, further comprising a conductor contacting both said first gate means and said semiconductor body to form a Schottky diode connected across said first gate means and said source.

24. A semiconductor device according to claim 14, in which: said channel region has an impurity concentration between $10^{12}$ and $10^{16}$ atoms/cm$^3$, said drain means and source have an impurity concentration between $10^{17}$ and $10^{21}$ atoms/cm$^3$, and said first and second gate means have an impurity concentration between $10^{17}$ and $10^{21}$ atoms/cm$^3$.

25. A semiconductor device according to claims 1, 2 or 3, further comprising a transistor formed in said semiconductor body and connected to said first gate means for supplying a current to said first gate means.

26. A semiconductor device according to claim 25, in which: said transistor comprises a collector connected to said first gate means, an emitter disposed adjacent to the collector, and a base disposed between the collector and emitter.

27. A semiconductor device according to claim 26, in which: said first gate means comprises a semiconductor region having a conductivity type opposite to that of said channel region, and said collector is merged in the first gate means.

28. A semiconductor device according to claim 26, in which: said transistor is encompassed by said second gate means.

29. A semiconductor device according to claim 28, in which: said first gate means is encompassed by said second gate means and encompass said transistor, and said collector is merged in the first gate means.

30. A semiconductor device according to claim 29, in which: said emitter is encompassed by said base, and the base is encompassed by said first gate means.

31. A semiconductor device according to claim 27, in which: said base and emitter are disposed between said first gate means and said second surface.

32. A semiconductor device according to claim 27, in which: said base is disposed on said first surface and contacting said first gate means, and said emitter is disposed on said base.

33. A semiconductor device according to claim 27, in which: said base and emitter are disposed between said first surface and said first gate means.

34. A semiconductor device according to claim 27, in which: all of said base, emitter and collector are arranged along said first surface.

35. A semiconductor device according to claim 25, in which: said transistor comprises another current channel region; another drain means and another source disposed at opposite ends of the another channel region, the another channel region providing a current path between the another drain means and another source; and another gate means disposed adjacent to the another channel region for defining a current channel in the another channel region, the another drain means being connected to said first gate means.

36. A semiconductor device according to claim 35, in which: said first gate means comprises a semiconductor region having a conductivity type opposite to that of said channel region, and said another drain means is merged in said first gate means.

37. A semiconductor device according to claim 36, in which: said another channel region, said another source and said another gate means are disposed between said first gate means and said second surface.

38. A semiconductor device according to claim 37, in which: said another gate means comprises a semiconductor region having the same conductivity type as that of said channel region, and is merged in said source.

39. A semiconductor device according to claim 35, in which: said another gate means comprises a MIS structure formed with an electrode, an insulator layer and said another channel region.

40. A semiconductor device according to claim 39, in which: said first gate means comprises a semiconductor region having a conductivity type opposite to that of said channel region, and said another drain means is merged in the first gate means.

41. A semiconductor device according to claim 39, in which: said transistor is encommpassed by said second gate means, and said another drain means is merged in said first gate means.

42. A semiconductor device according to claim 41, in which: said another source is encompassed by said another channel region, and the another channel region is encompassed by said first gate means.

43. A semiconductor device according to claims 1, 2 or 3 in which:
one of said source and drain means is a semiconductor region disposed in the vicinity of said first surface and adapted for being used as a storage region,
said device further comprising:
an insulator region disposed on said storage region;
an electrode disposed on said insulator region; and
a bit line connected to the other of said source and drain means,
said channel region being substantially defined by said first and second gate means and capable of establishing a potential barrier for charge carriers under the control of said first and second gate means, whereby constituting a memory cell.

44. A semiconductor device according to claims 1, 2 or 3 in which:
one of said source and drain means formed with a semiconductor region is disposed in the vicinity of said first surface;
said device further comprising:
a bit line formed with said first surface and disposed on said one of said source and drain,
the other of said source and drain means being a semiconductor region and having another conductivity type opposite to the certain conductivity type of the semiconductor body and forming a pn junction between the other of said source and drain means and said semiconductor body, thereby adapted for being used as a storage region,
said channel region being defined substantially by said first and second gate means and being capable of establishing a potential barrier for charge carriers under a control of said first and second gate means,
whereby constituting a memory cell.

45. A semiconductor memory device formed in a semiconductor body and including at least one memory cell, said memory cell comprising:
a source region having a source potential associated therewith;
a storage region;
a channel semiconductor region disposed between said source region and said storage region and providing a path of charge carriers therebetween;
split gate regions including a first gate region and a second gate region disposed adjacent to a same portion of said channel region and jointly defining a channel in said channel region;
said first gate region being adapted to respond to a controlling signal;
said second gate region being adapted to receive a dc bias voltage; and
said source, channel, storage and split gate regions being disposed in said semiconductor body, and said channel region being capable of establishing a potential barrier under control of at least said source potential and said first gate controlling signal.

46. A semiconductor memory device formed in a semiconductor body and including at least one memory cell, said memory cell comprising:
a source region having a source potential associated therewith;
a storage region;
a channel semiconductor region disposed between said source region and said storage region and providing a path of charge carriers therebetween; and
split gate regions including a first gate region and a second gate region disposed adjacent to a same portion of said channel region and jointly defining a channel in said channel region;
said first gate region being adapted to be given a controlling signal;
said second gate region being electrically floated; and
said source, channel, storage and split gate regions being disposed in said semiconductor body, and said channel region being capable of establishing a potential barrier under control of at least said source potential and said first gate controlling signal.

47. A semiconductor memory device formed in a semiconductor body and including at least one memory cell, said memory cell comprising:
a source region having a source potential associated therewith;
a storage region;
a channel semiconductor region disposed between said source region and said storage region and providing a path of charge carriers therebetween; and
split gate regions including a first gate region and a second gate region disposed adjacent to a same portion of said channel region and jointly defining a channel in said channel region;
said first gate region being adapted to be given a controlling signal; and
said second gate region being electrically floated; said source, channel, storage and split gate regions being disposed in said semiconductor body, and said channel region being capable of establishing a potential barrier under control of at least said source potential and said first gate controlling signal.

48. A semiconductor memory device according to claims 45, 46 or 47 in which: said source and storage regions are disposed substantially perpendicular to the surface of said semiconductor body.

49. A semiconductor memory device according to claims 45, 46 or 47 in which: one of said source and storage regions is disposed in the vicinity of the surface of said semiconductor body, and the other of said source and storage regions is disposed in the bulk of said semiconductor body.

50. A semiconductor memory device according to claim 45, 46 or 47, in which: said memory device includes a plurality of said memory cells and each of said memory cells includes each said second gate region which is formed in one common region in said semiconductor body.

51. A semiconductor memory device according to claims 45, 46 or 47 in which: at least one of said split gate regions forms a pn junction with said channel region.

52. A semiconductor memory device according to claims 45, 46 or 47 in which: at least one of said split gate regions is a Schottky electrode formed on said channel region.

53. A semiconductor memory device according to claims 45, 46, or 47 in which: at least one of said split gate regions is an insulated electrode formed on said channel region.

54. A semiconductor memory device according to claims 45, 46 or 47 in which: said split gate regions have a surface coplanar with the surface of said semiconductor body.

55. A semiconductor memory device according to claims 45, 46 or 47 in which: said semiconductor body has at least one recessed portion and at least one of said split gate regions is formed in said recessed portion.

56. A semiconductor memory device according to claim 55, in which: said at least one memory cell further comprises an insulator region filling said recessed portion.

57. A semiconductor memory device according to claims 45, 46 or 47 in which: said storage region is formed with a highly doped region of a conductivity type.

58. A semiconductor memory device according to claim 57, in which: said channel region is formed with a first semiconductor region having a low impurity concentration of another conductivity type opposite to said a conductivity type disposed adjacent to said storage region and forming a pn junction therebetween.

59. A semiconductor memory device according to claims 45, 46 or 47 further comprising an insulator substrate, said semiconductor body being formed on said insulator substrate.

60. A semiconductor memory device according to claim 59, in which: said source region is disposed adjacent to said insulator substrate and said storage region is disposed in the vicinity of a surface of said semiconductor body.

61. A semiconductor memory device according to claims 45, 46 or 47 in which: said storage region is disposed in the vicinity of a surface of said semiconductor body, and said memory cell further comprises an insulating layer disposed on the surface of said semiconductor body and a conducting electrode layer disposed on said insulating layer.

62. A semiconductor memory device according to claim 61, in which: said insulating layer has a reduced thickness at site located at least over a portion of said storage region.

63. A semiconductor memory device according to claims 45, 46 or 47 in which: said storage region has a conductivity type and disposed in the bulk of said semiconductor body and said semiconductor body further includes a second semiconductor region of another conductivity type opposite to said a conductivity type, said storage region and said second semiconductor region are disposed adjacent to each other to form a pn junction therebetween.

64. A semiconductor memory device according to claim 50, in which: said common region has an aperture for each said memory cell and another of said split gate regions of each memory cell is disposed inside said aperture.

65. A semiconductor memory array, comprising: a semiconductor body; a plurality of bit lines and a plurality of word lines crossing each other; and at least one semiconductor memory cell disposed at one of cross points of said bit lines and said word lines, said semiconductor memory cell comprising: a source region having a source voltage associated therewith; a storage region; a channel region connecting said source and storage regions, and split gate regions including a first gate region and a second gate region disposed adjacent to a same portion of said channel region for establishing a potential barrier in said channel region, said first gate region being responsive to a controlling signal, said second gate region being responsive to a dc bias voltage, the height of said potential barrier being controllable by the voltages of said source region and said first gate region.

66. A semiconductor memory array, comprising: a semiconductor body; a plurality of bit lines and a plurality of word lines crossing each other; and at least one semiconductor memory cell disposed at one of cross points of said bit lines and said word lines, said semiconductor memory cell comprising: a source region having a source voltage associated therewith; a storage region; a channel region connecting said source and storage regions; and split gate regions including a first gate region and a second gate region disposed adjacent to a same portion of said channel region for establishing a potential barrier in said channel region, said first gate region being responsive to a controlling signal, and second gate region being electrically connected to said source region, the height of said potential barrier being controllable by the voltages of said source region and said first gate region.

67. A semiconductor memory array, comprising: a semiconductor body, a plurality of bit lines and a plurality of word lines crossing each other; and at least one semi conductor memory cell disposed at one of cross points of said bit lines and said word lines, said semiconductor memory cell comprising: a source region having a source voltage associated therewith; a storage region; a channel region connecting said source and storage regions; and split gate regions including a first gate region and a second gate region disposed adjacent to a same portion of said channel region for establishing a potential barrier in said channel region, said first gate region being responsive to a controlling signal, said second gate region being electrically floated; the height of said potential barrier being controllable by the voltages of said source region and said first gate region.

68. A semiconductor memory array according to claim 65, 66, or 67, in which: said source region is electrically connected to one of said bit lines, and one of said split gate regions is electrically connected to one of said word lines.

69. A semiconductor memory array according to claim 68, in which: said source region constitutes said one bit line.

70. A semiconductor memory array according to claim 68, in which: said first gate region constitutes said one word line.

71. A semiconductor memory array according to claim 68, in which: said storage region is disposed in the neighborhood of the surface of said semiconductor body, and said semiconductor memory cell further comprises an insulating layer formed on a surface of said semiconductor body and a conducting electrode formed on said insulating layer above said storage region and adapted to be applied with a controlling voltage.

72. A semiconductor memory array according to claim 71, in which: said source region constitutes said one of said bit lines.

73. A semiconductor memory array according to claim 68, in which: said storage region has a conductinity type and disposed in the bulk of said semiconductor body, and said semiconductor body further includes a second semiconductor region of another conductivity type opposite to said a conductivity type, and said storage region and said second semiconductor region are disposed adjacent to each other to form a pn junction therebetween.

74. A semiconductor memory device formed in a semiconductor body and including at least one memory cell which comprises:
a source region having a source voltage associated therewith;
a storage region;
a channel region disposed between said source and storage regions and providing a path of charge carriers therebetween; and
split gate regions including a first gate region and a second gate region disposed adjacent to a same portion of said channel region for establishing a potential barrier in said channel region, said first gate region being responsive to a controlling signal, said second gate region being adapted to be given a dc bias voltage, the height of said potential barrier being controllable by the voltages of said source region and said first gate region.

75. A semiconductor memory device formed in a semiconductor body and including at least one memory cell which comprises:
   a source region having a source voltage associated therewith;
   a storage region;
   a channel region disposed between said source and storage regions and providing a path of charge carriers therebetween; and
   split gate regions including a first gate region and a second gate region disposed adjacent to a same portion of said channel region for establishing a potential barrier in said channel region, said first gate region being responsive to a controlling signal, said second gate region being electrically connected to said source region, the height of said potential barrier being controllable by the voltages of said source region and said first gate region.

76. A semiconductor device formed in a semiconductor body and including at least one memory cell which comprises:
   a source region having a source voltage associated therewith;
   a storage region;
   a channel region disposed between said source and storage regions and providing a path of charge carriers therebetween; and
   split gate regions including a first gate region and a second gate region disposed adjacent to a same portion of said channel region for establishing a potential barrier in said channel region, said first gate region being responsive to a controlling signal, said second gate region being electrically floated, the height of said potential barrier being controllable by the voltages of said source region and said first gate region.

77. In a semiconductor device of the type including source, drain, and channel semiconductor regions, in predetermined disposition to a principal surface said source drain and channel semiconductor regions being of a first conductivity type and relatively disposed in a semiconductor body to define a current path between said source and drain regions through said channel region, and further including gate means, responsive to a control signal applied thereto, for controllably generating a depletion layer extending into said channel region to control current flow through said current path in accordance with said control signal, the improvement wherein:
   said current path being generally perpendicular to said principal surface;
   said gate means comprises firt and second gate semi conductor regions of a second conductivity type opposite to said first conductivity type, each disposed in said semi conductor body separate from the other, adjacent to a common portion of said channel region;
   said first and second gate regions cooperating to control current flow along said path through said common portion of said channel region, with each said first and second gate region being electrically separated from the other, and with only said first gate region being responsive to said control signal and said second gate region being adapted to generate a depletion layer extending into said common portion of said channel region independently of said control signal.

78. A semiconductor memory device formed in a semiconductor body having a principal surface comprising:
   a source semiconductor region,
   a storage semiconductor region
   a channel semiconductor region, said channel semiconductor region being disposed in said semiconductor body between said source and storage regions and providing a charge carrier path therebetween, said path being generally perpendicular to said principal surface and
   gate means, disposed in said semiconductor body and responsive to a control signal applied thereto, for generating a depletion layer extending into a portion of said channel region for controlling the flow of charge carriers through said channel portion along said paths in accordance with said control signal;
   said gate means comprising first and second gate semiconductor regions each disposed separated from the other and adjacent to said portion of the channel region;
   each said first and second gate regions being electrically separated from the other, and adapted to generate independent depletion layers extending into said portion of said channel region, said first gate region depletion layer being in accordance to said control signal, and said second gate region depletion layer being independent of said control signal.

79. The device of claim 77 or 78, wherein said second gate region is responsive to a dc bias voltage.

80. The device of claim 77 or 78, wherein said second gate region is electrically connected to said source region.

81. The device of claim 77 or 78, wherein said second gate region is electrically floated.

82. In a semiconductor device of the type including source, drain and channel semiconductor regions of a first conductivity type said source drain and channel semiconductor regions being relatively disposed in a semiconductor body to define a current path between said source and drain regions through said channel region, said current path being generally perpendicular to a principal surface of said semiconductor body said device further including gate means, responsive to a control signal applied thereto, for controllably generating a depletion layer extending into said channel region in accordance with said control signal to control current flow along said current path, the improvement wherein said gate means comprises:
   a first semiconductor region of a second conductivity type opposite to said first conductivity type, disposed adjacent to a portion of said channel region, and generating a depletion layer extending into said channel region portion in accordance with said control signal; and
   means for reducing gate capacitance and minority carrier storage effect in said device, said means for reducing comprising a second gate semiconductor region disposed separated from said first gate region adjacent to said channel region portion, said second gate region being electrically separated from said first gate region, and adapted to generate a depletion layer extending into said channel region portion, independently of said control signal, said first and second gate regions cooperating to control current flow through said channel portion.

* * * * *

UNITED STATES PATENT AND TRADEMARK OFFICE
CERTIFICATE OF CORRECTION

PATENT NO. : 4,284,997

DATED : August 18, 1981

INVENTOR(S) : Jun-ichi NISHIZAWA

It is certified that error appears in the above-identified patent and that said Letters Patent is hereby corrected as shown below:

On The Title Page

Please add to Item [30] the following omitted Foreign Application Priority Data:

December 24, 1977    Japan.....52-156149

December 31, 1977    Japan.....52-157629

In the Claims

Delete claim 15, column 31, lines 7-9

Claim 19, column 31, line 22, read "occurence" as --occurrence--

Claim 41, column 32, line 47, read "encommpassed" as --encompassed--

Claim 44, column 33, line 9, after "drain" insert --means--

Claim 67, column 36, line 10, read "semi conductor" as --semiconductor--

Claim 68, column 36, lines 25-36, read "one of said split gate regions" as --said first gate region--

UNITED STATES PATENT AND TRADEMARK OFFICE
CERTIFICATE OF CORRECTION

PATENT NO. : 4,284,997

DATED : August 18, 1981

INVENTOR(S) : Jun-ichi NISHIZAWA

It is certified that error appears in the above—identified patent and that said Letters Patent is hereby corrected as shown below:

Claim 77, column 37, line 55, read "firt" as --first--

In Claims 4, 5, 6, 9, 12, 14, 25, 43, 44, 48, 49, 51, 52, 53, 54, 55, 57, 59, 61 and 63, read "claims" as --claim--

Signed and Sealed this

Fourteenth Day of September 1982

[SEAL]

Attest:

GERALD J. MOSSINGHOFF

Attesting Officer

Commissioner of Patents and Trademarks